(12) United States Patent
Siri

(10) Patent No.: US 9,853,573 B2
(45) Date of Patent: Dec. 26, 2017

(54) GRID-TIE INVERTER WITH ACTIVE POWER FACTOR CORRECTION

(71) Applicant: THE AEROSPACE CORPORATION, El Segundo, CA (US)

(72) Inventor: Kasemsan Siri, Torrance, CA (US)

(73) Assignee: The Aerospace Corporation, El Segundo, CA (US)

( * ) Notice: Subject to any disclaimer, the term of this patent is extended or adjusted under 35 U.S.C. 154(b) by 0 days.

(21) Appl. No.: 15/082,153

(22) Filed: Mar. 28, 2016

(65) Prior Publication Data

US 2017/0279376 A1  Sep. 28, 2017

(51) Int. Cl.
| | |
|---|---|
| H02M 7/538 | (2007.01) |
| H02M 7/5387 | (2007.01) |
| H02M 1/08 | (2006.01) |
| H03L 7/099 | (2006.01) |
| H02M 7/15 | (2006.01) |

(52) U.S. Cl.
CPC ......... *H02M 7/53871* (2013.01); *H02M 1/08* (2013.01); *H02M 7/15* (2013.01); *H02M 7/538* (2013.01); *H03L 7/099* (2013.01)

(58) Field of Classification Search
CPC .................................................... H02M 7/538
See application file for complete search history.

(56) References Cited

U.S. PATENT DOCUMENTS

| | | | |
|---|---|---|---|
| 4,445,049 | A | 4/1984 | Steigerwald |
| 7,193,872 | B2 | 3/2007 | Sid |
| 7,324,361 | B2 | 1/2008 | Sin |
| 2003/0012038 | A1* | 1/2003 | Welches ................ H02M 1/126 363/34 |
| 2009/0316454 | A1* | 12/2009 | Colbeck .............. H02M 1/4225 363/89 |
| 2012/0020137 | A1* | 1/2012 | Abe ....................... H02M 7/487 363/132 |

(Continued)

OTHER PUBLICATIONS

Kasemsan Siri, "Voltage-Mode Grid-Tie Inverter with Active Power Factor Correction" published by the American Institute of Aeronatics and Astronautics during the 13th International Energy Conversion Engineering Conference in Orlando, Florida on Jul. 27-29, 2015.

(Continued)

*Primary Examiner* — Jue Zhang
*Assistant Examiner* — Trinh Dang
(74) *Attorney, Agent, or Firm* — LeonardPatel PC

(57) ABSTRACT

A grid-tie inverter (the "inverter") may include a power converter that receives a direct current (DC) output voltage from a DC input power source, and generates an alternating current (AC) output voltage for transmission to a utility power grid. The inverter may also include a system controller that regulates the AC output voltage to efficiently transfer power to the utility power grid while a system AC load may be terminated across the output of the inverter. The inverter may also provide active power factor correction between the utility grid voltage and current. Furthermore, the inverter may also offer harmonic cancellation, which minimizes or eliminates the harmonic content out of the utility power grid voltage and current.

25 Claims, 29 Drawing Sheets

(56) References Cited

U.S. PATENT DOCUMENTS

| | | | | |
|---|---|---|---|---|
| 2012/0026758 A1* | 2/2012 | Lee | ............... | H02M 3/33576 363/21.13 |
| 2013/0107601 A1* | 5/2013 | Wagoner | ............... | H02M 7/003 363/141 |
| 2015/0365030 A1* | 12/2015 | Tsai | ............... | H02P 7/29 318/504 |
| 2016/0353555 A1* | 12/2016 | Chen | ............... | H05B 37/0272 |

OTHER PUBLICATIONS

Kasemsan Siri, "Voltage-Mode Grid-Tie Inverter with Active Power Factor Correction" USB Proceeding of 2015 IEEE 24th International Symposium on Industrial Electronics (ISIE), pp. 1209-1215, Jun. 3-5, 2015, Buzios, Brazil.

* cited by examiner

2100

2200

GRID-TIE INVERTER WITH ACTIVE POWER FACTOR CORRECTION

FIELD

The present invention relates to a grid-tie inverter, and more particularly, to a grid-tie inverter with active power factor correction.

BACKGROUND

Conventional grid-tie inverters utilize a current-mode control approach that injects an in-phase alternative current (AC) of a sinusoidal waveform into the utility grid. This has been accomplished without active power factor correction with respect to a nearby load, which shares the same grid voltage and the utility power transmission line. In general, the grid impedance with the long transmission line does not preserve an ideal voltage source characteristic, exhibiting a reactive impedance component such as some inductive component with some resistive component. Consequently, the almost ideal voltage source characteristics of the utility grid may not always exist and the current-mode control approach used to actively achieve the sinusoidal waveform of the inverter output current may not be possible.

Some distortion of the inverter output current may not be avoidable using the current-mode control approach, because the driving voltage within the inverter power stage has a very limited magnitude. This limited magnitude prohibits its ability to fully realize an ideal sinusoidal current-source waveform. Alternatively, the inverter power stage can be controlled to be a voltage source, allowing the inverter output current to become a natural response of the inverter and the utility grid. The inverter and the utility grid are interconnected to co-dependently contribute to the system response. Practically, the inverter output voltage of a sinusoidal waveform is much easier to achieve as compared to the inverter output current, which is a dependent response.

Thus, a voltage-mode grid-tie inverter that delivers its sinusoidal output current as a natural response of the interconnected inverter and utility grid may be beneficial.

Despite the variety of load types (e.g., resistive, capacitive, or inductive) that are terminated across the inverter output, both the wave-shape and the phase of the inverter output voltage are independently controllable with respect to the grid voltage. The grid current is simply the natural response, which can be managed to be either in phase or out of phase with the grid voltage, i.e., active power factor correction. The conventional current-source inverter requires a sufficient control bandwidth to regulate its output current waveform to be sinusoidal, leading to difficulties to achieve stable control due to the uncontrollable interactions existing between the back-end electromagnetic interference (EMI) filter's resonance and the inverter current-source control loop. To avoid the difficult issues of instability associated with the conventional current-source inverter, it may be beneficial to have a voltage-source inverter that includes a control loop designed for stable operation even with a non-ideal utility grid, which may possess far from ideal characteristics of a voltage source.

SUMMARY

Certain embodiments of the present invention may provide solutions to the problems and needs in the art that have not yet been fully identified, appreciated, or solved by current-source grid-tie inverters. For example, in some embodiments, a grid-tie inverter may deliver a sinusoidal output current as a natural response of an interconnected inverter and utility grid.

In an embodiment, an apparatus includes a power converter that receives a direct current (DC) output voltage from a DC input power source, and generates an alternating current (AC) output voltage for transmission to a utility power grid. The apparatus may also include a system controller that regulates the AC output voltage to efficiently transfer power to the utility power grid.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE EMBODIMENTS

A voltage-mode grid-tie solar inverter (hereinafter "inverter") may adapt an output of, for example, a solar array source or other direct current (DC) power source for use with a utility power grid. The adapted output may maintain properly regulated power output from the source, efficiently transferring the power to the utility power grid, absorbing reactive power components produced by the load, and maximizing a power factor of the utility power grid. In some embodiments, solar array voltage and power are regulated, and converter output current and voltage are controlled. Various supporting controllers may be included such as protection modes controllers that are implemented for over-voltage protection, over-current protection, under-voltage protection, and over-temperature protection.

Figure 1A:
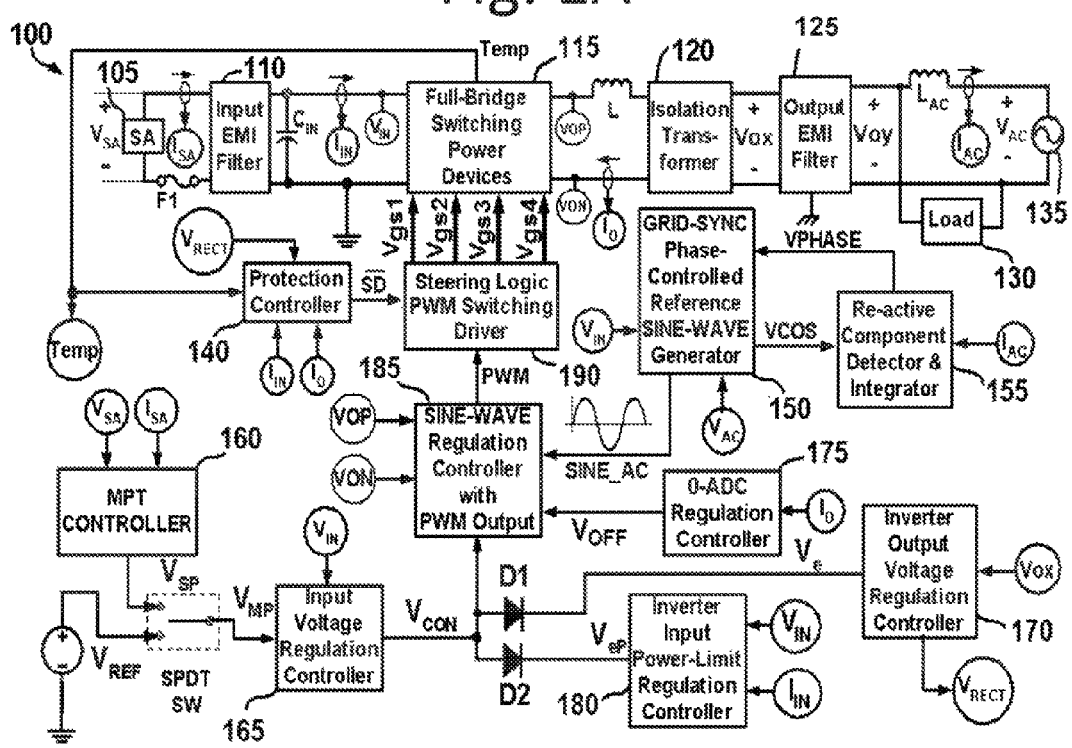
FIGS. 1A to 1D are block diagrams illustrating an inverter, according to an embodiment of the present invention.

FIG. 1A is a block diagram illustrating a voltage-mode grid-tie solar inverter (or inverter) 100, according to an embodiment of the present invention. For purposes of explanation, voltage-mode grid-tie solar inverter 100 will be referred to as inverter 100. Inverter 100 may include a power converter that in some embodiments receives a DC source voltage (or output voltage) $V_{SA}$ from a DC input power source such as a solar array (SA) 105. The power converter may provide AC output voltage Voy through a single power stage of DC-AC conversion to a utility power grid (or "utility grid"). The power converter in some embodiments may include an input EMI filter 110, full-bridge switching power devices (or network) 115, isolation transformer 120, and an output EMI filter 125, and may be in the form of a cascaded connection. In certain embodiment, isolation transformation 120 may be excluded from the power converter when electrical isolation between the input power source and the utility grid comprising load 130 is not required.

Inverter 100 may also include a system controller that includes a full-time controller and a plurality of supporting controllers. In some embodiments, full-time controller may include five basic controllers: (1) SINE-WAVE regulation controller with PWM 185, (2) reference SINE-WAVE generator 150, (3) 0-ADC regulation controller 175, (4) steering logic PWM switching driver 190, and (5) protection controller 140. As a design option, protection controller 140 may in some embodiments provide a shutdown of the power supply when a protection event occurs. Protection events may include an over temperature of full-bridge switching network 115, an input over-current $I_{IN}$, an output over-current $I_O$, an output overvoltage $V_{OX}$, and an output undervoltage $V_{OX}$.

In some embodiments, the supporting controllers include reactive component detector and integrator 155 for active power correction, input voltage regulation controller 165 for input voltage regulation of the power supply, inverter input power limit controller 180 to limit the absorbed input power and not exceed the power rating of the power supply, inverter output voltage regulation controller to limit or regulate the inverter output voltage and not exceed a pre-determined voltage threshold, and a maximum power tracking (MPT) controller 160 to produce a peak-power voltage set-point voltage $V_{SP}$ allowing input voltage regulation controller 165 to regulate the inverter input voltage $V_{IN}$.

The system controller, and in some embodiments, which may be actively operational under the full-time controller, input voltage regulation controller 165, and the MPT controller 160, may regulate a DC output voltage $V_{SA}$ at or above an assigned referenced voltage $V_{MP}$. The assigned reference voltage $V_{MP}$ may selectively switched between a fixed reference voltage $V_{REF}$ or a continuously updated peak-power set-point voltage $V_{SP}$. System controller, and in some embodiments, the full-time controller and analog control voltage $V_{CON}$ may control the waveform of the output voltage Voy from power converter to be sinusoidal and/or to have the same frequency as the utility grid frequency. The system controller, and in some embodiments, which may be actively operational under the full-time controller and the re-active component detector and integrator 155, may control the utility grid current to be either in phase or out of phase with respect to the utility grid's voltage.

The system controller, and in some embodiments, which may be actively operational under the full-time controller, inverter output voltage regulation controller 170, and a first pull-down diode D1, may regulate the AC output voltage Voy to not exceed a pre-determined threshold. The system controller, and in some embodiments, the full-time controller, inverter input power-limit regulation controller 180, and a second pull-down diode D2 may limit the absorbed input power to or not above the rate power of the power supply, when the power source supplies, or is capable of supplying, the input power of greater than the rated power of the power supply. In these embodiments including controller 180, the available input power may exceed the rated power of the power supply. In other embodiments, the available input power may exceed the rate power of the power supply and the power demanded by a stand-alone AC load. See, for example, FIG. 1C. The stand-alone AC load in some embodiments with the controller 180 can be prevented from exceeding the rate power of the power supply.

In some embodiments, utility grid may include at least a series connection of an AC utility voltage source $V_{AC}$ and an inductive impedance of the utility power transmission cable. In certain embodiment, AC load may include an AC load circuit and a set of parallel connected AC loads that are connected in parallel with the utility grid. In other embodiments, AC load may include a stand-alone load circuit and a set of parallel-connected AC loads that are isolated from, and not connected to, the utility grid. In either of these embodiments, The AC load circuit may be a resistive load, inductive load, a capacitive load, or a combination thereof.

The total load power of less than the total output power delivered by the power supply in some embodiments may lead to the in-phase grid current with respect to the utility grid voltage $V_{AC}$. In other embodiments, the total load power of greater than the total output power delivered by the power supply in some embodiments may lead to the out-of-phase grid current with respect to the utility grid voltage $V_{AC}$. The utility grid voltage $V_{AC}$ may be defined in some embodiments as an AC voltage $V_{AC}$ at the utility grid's sourcing end of the grid transmission cable or the AC voltage $V_{AC}$ at the utility grid's destination end of the grid transmission cable, which is the AC voltage $V_{OY}$ across the output of the power supply (or redefine $V_{OY}$ as the alternative feedback input to the SINE-WAVE generator 150 instead the utility grid voltage $V_{AC}$ shown in FIG. 1A). The in-phase utility grid current may be defined as the conventional AC current $I_{AC}$ being injected by the power supply output into the utility grid. The out-of-phase utility grid current may be defined as the AC current $I_{AC}$ delivered from the utility grid into the AC load 130.

In some embodiments, inverter 100 adapts an output of SA 105 for connection to a utility power grid. In FIG. 1A, the utility grid may be represented by an AC voltage source 135. In certain embodiments, power flow may proceed from left to right along power components at the top of FIG. 1A, while feedback and control signals and their interconnected controller blocks are shown below the top row of the power components. The power components in this embodiment include input EMI filter 110, bulk filter capacitor $C_{IN}$, full-bridge switching power devices 115, switching inductor L, isolation transformer 120, output EMI filter 125, and utility grid interfacing inductor $L_{AC}$. Full-bridge switching network 115 may include a plurality of switching power devices.

SA 105, which produces DC source (or solar array) current $I_{SA}$ and DC source (or solar array) voltage $V_{SA}$, is connected to input EMI filter 110. In some embodiments, input EMI filter 110 may be the input of inverter 100. Capacitor $C_{IN}$ may terminate across the output of input EMI filter 110 in certain embodiments, and ensure that DC source current $I_{SA}$ and DC source voltage $V_{SA}$ have a negligible AC ripple at the inverter switching frequency. Capacitor $C_{IN}$ may ensure that DC source current $I_{SA}$ and DC source voltage $V_{SA}$ possesses a detectable AC voltage ripple that is twice the frequency of the utility grid for maximum power tracking operation.

Input EMI filter 110 in some embodiments provides both common-mode and differential-mode filtering for switching input current $I_{IN}$, which is drawn by full-bridge switching network (or full-bridge inverter circuit) 115. Feedback and control may be provided to full-bridge switching network 115 through input voltage regulation controller (or input voltage regulation error amplifier) 165, inverter input power-limit regulation controller 180, inverter output voltage regulation controller 170, protection controller 140, re-active component detector and integrator 155, grid-sync phase-controlled reference SINE-WAVE generator 150, SINE-WAVE regulation controller with PWM output 185, 0-ADC regulation controller 175, and steering logic PWM switching driver 190.

In addition to feedback signals for control purposes, full-bridge switching network 115 may convert DC input power from SA 105 into AC output power, through power-stage switching inductor L, isolation transformer 120, and output EMI filter 125. The AC output power may then be absorbed by load 130 and the utility grid circuit. The utility grid circuit in some embodiments (FIGS. 1A and 1B) may include an AC voltage source 135 and a series-connected grid-interface inductor $L_{AC}$. Load 130 and the utility grid circuit are connected in parallel in some embodiments.

Figure 1B:
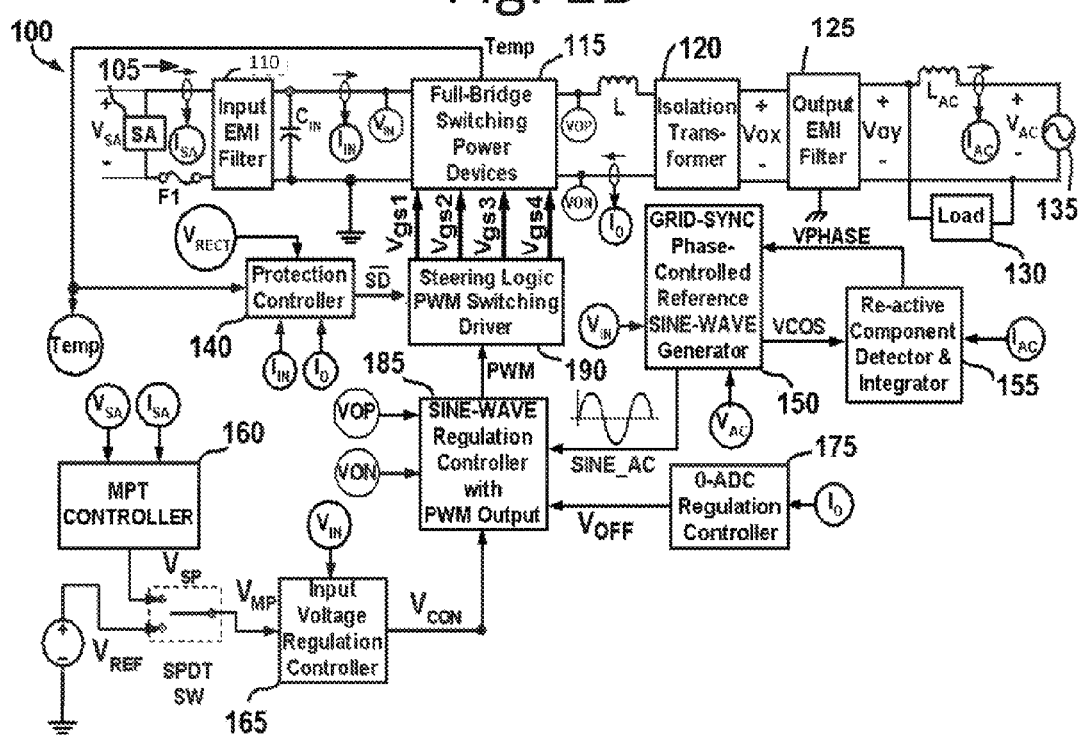

Referring now to FIG. 1B, when inverter 100 has a limited power source, which is known to provide the source power of less than the rated power of inverter 100, inverter output voltage regulation controller 170 and inverter input power-limit regulation controller 180 are not needed. Controller 180 may be absent in some embodiments because the chosen power source cannot produce more power than the power rating of inverter 100 (i.e., the power supply's rated power). Controller 170 may also be absent in some embodiments because the chosen utility grid is known to always produce a stable AC voltage, which possesses its RMS value within the acceptable voltage range at all times. In some embodiments with a stand-alone load configuration (FIG. 1D), however, inverter 100 may include inverter output voltage regulation controller 170 and exclude inverter input power-limit regulation controller 180. In the embodiments shown in FIGS. 1C and 1D, only a stand-alone load 130 is terminated across the inverter's output (without connecting to the utility grid). Therefore, controller 170 is needed in stand-alone load configurations because the inverter output voltage should be regulated to not exceed the operating threshold of the inverter output AC voltage. This may prevent an excessive AC output voltage at any load condition having its operating power of less than the power rating of the inverter 100.

Figure 1C:
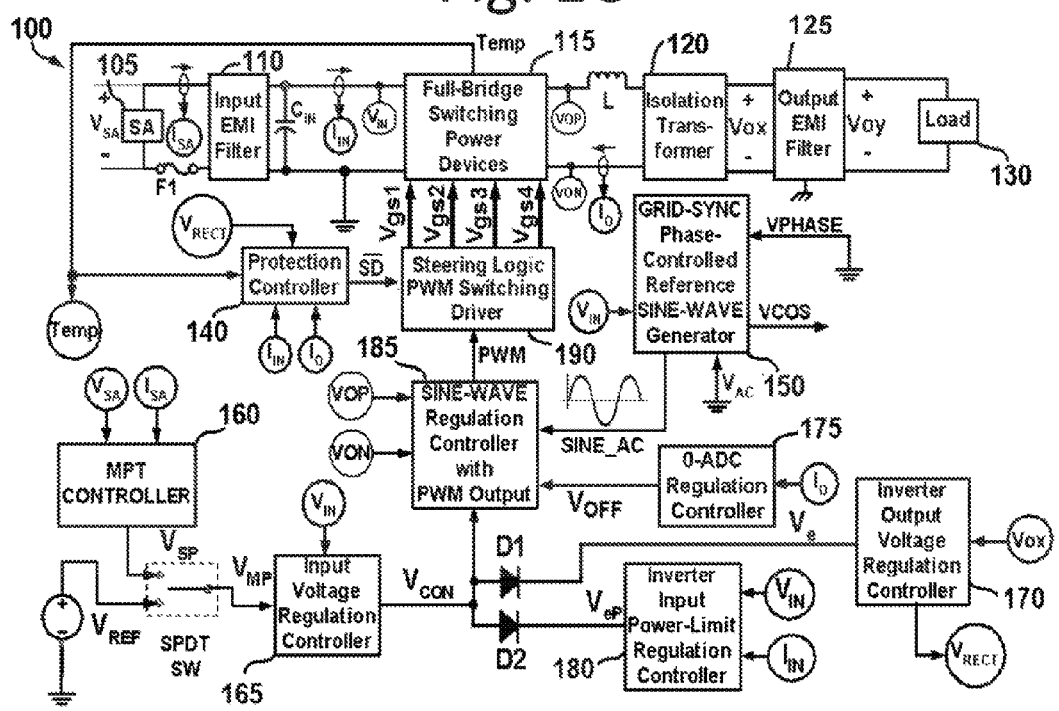

Referring to FIG. 1C, for example, the output of inverter 100 is connected to a stand-alone load 130, without a utility grid. In these embodiments, active power correction is not required, because the utility grid current is not present. Furthermore, GRID-SYNC phase controlled reference SINE-WAVE generator 150 may set inputs, such as VPHASE and the AC voltage $V_{AC}$, are tied to zero voltage or ground. VCOS in these embodiments may be an output that is not used. Internally, GRID-SYNC phase controlled reference SINE-WAVE generator 150 may include a free-running oscillator that operates at its own frequency, and outputs a SINE_AC signal that allows inverter 100 to produce a sinusoidal output waveform to regulate voltage Vox to be a constant AC voltage source. Voltage Vox may be operated in some embodiments by inverter output voltage regulation controller 170.

Figure 1D:
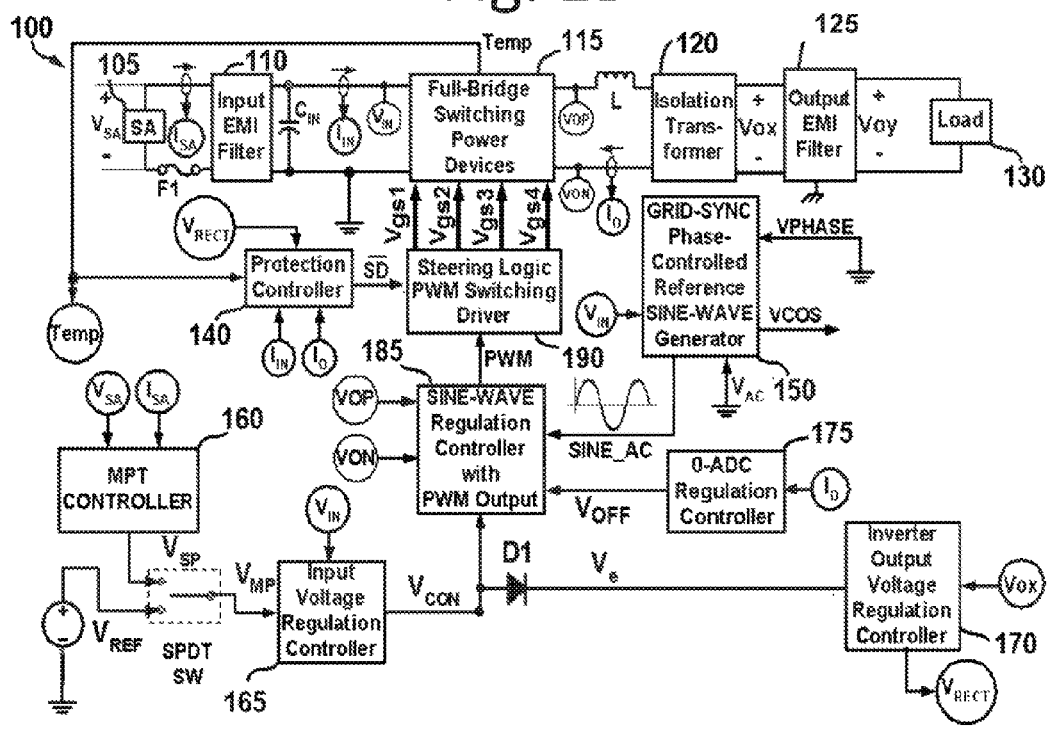

Similar to FIG. 1C, inverter 100 in FIG. 1D is in a standalone configuration, i.e., inverter is connected to load 130. In this embodiment of FIG. 1D, when input power source possesses the available peak power of less than the power rating of inverter 100, the output voltage of inverter 100 should still be regulated to be sinusoidal. In order to regulate the output voltage of inverter 100, inverter output voltage regulation controller 170 is utilized and inverter input power-limit regulation controller 180 is not required. Inverter input power-limit regulation controller 180 is not required in these embodiments, since the available peak power of the DC power source is less than the power rating of inverter 100.

Maximum Power Tracking Control

Employing DC source voltage $V_{SA}$ and DC source current $I_{SA}$ as the feedback signals, maximum power tracking (MPT) controller 160 continuously updates a set-point reference voltage $V_{SP}$. Set-point reference voltage $V_{SP}$ in some embodiments commands input voltage regulation controller (or SA voltage regulation error amplifier) 165 to produce an error voltage control signal $V_{CON}$ for regulation of the DC source voltage $V_{SA}$ at the level corresponding to the set-point reference voltage $V_{SP}$ (or maximum peak-power voltage $V_{MP}$). Upon reaching a steady state of operation, DC source voltage $V_{SA}$ is controlled to swing back and forth around the maximum peak-power voltage $V_{MP}$ with an acceptable AC-voltage ripple having a fundamental frequency of twice the utility frequency.

MPT controller 160 in some embodiments may regulate the DC source voltage $V_{SA}$ at the maximum peak-power voltage $V_{MP}$. In other embodiments, the DC source voltage $V_{SA}$ may be regulated at a preset voltage corresponding to an internal reference voltage $V_{REF}$. In such an embodiment, maximum peak-power voltage $V_{MP}$ is set equal to internal reference voltage $V_{REF}$ instead of set-point reference voltage $V_{SP}$ through a selectable switch (SPDT SW). Input voltage regulation controller 165 may provide an error voltage control signal $V_{CON}$ in some embodiments. The error voltage control signal $V_{CON}$ may serve as a command voltage and may be band-limited to have a negligible AC ripple voltage. The fundamental frequency of the AC ripple voltage may be at twice the utility frequency and above. The error voltage control signal $V_{CON}$ may command SINE-WAVE regulation controller 185 to deliver a PWM switching signal. The PWM switching signal may be fed to a steering logic PWM switching driver 190 to produce a plurality of PWM switching signals. In some embodiments, steering logic PWM switching driver 190 may produce four PWM switching signals. These PWM switching signals may provide on/off switching drives to corresponding power switching devices within the full-bridge switching network 115.

DC-AC Switching Bridge with Output Isolation and Emi Filter

In some embodiments, output terminals VOP and VON of full-bridge switching network 115 may provide a differential-mode switching AC voltage. The differential-mode switching AC voltage may possess a repetitive pulsating train of the switched input voltage of which the pulse-width is varied in time as a sinusoidal function having a fundamental frequency matched with the utility grid frequency. Differential-mode switching voltages V(VOP,VON) may possess two switching states in some embodiments. These two controlled switching states of the switched input voltage; i.e. V(VOP,VON)=+$V_{IN}$ or -$V_{IN}$, are achieved by the pulse-width modulation between these two switching voltages. The PWM may occur repetitively at a switching frequency of at least 200 times the utility frequency in certain embodiments. The PWM switching frequency, for example, may be 10 kHz and above.

In certain embodiments, full-bridge switching network 115 may include a DC-AC switching bridge inverter subsystem. This subsystem may provide a switching output voltage across output terminals VOP and VON, effectively providing a differential-output switching voltage V(VOP)–V(VON). The differential-output switching voltage V(VOP)–V(VON) may have a fundamental frequency of the utility frequency with an AC voltage of a sinusoidal waveshape in synchronization with the AC utility-grid voltage.

At the utility grid frequency, the phase of the differential output switching voltage V(VOP)–V(VON), of which the switching voltage ripple may be low-pass filtered by a main inductor L, isolation transformer 120 and output EMI filter 125, may be controlled such that output EMI filter 125 delivers excess power from SA 105 as an in-phase AC (or utility grid) current $I_{AC}$ into the utility grid voltage $V_{AC}$ through the utility grid interfacing inductor $L_{AC}$. The in-phase AC current $I_{AC}$ may be achieved when load 130 demands less power than the available maximum power of SA 105 or the internal limiting power controlled by the control loop of inverter 100, whichever is less. The amplitude and phase of the inverter output voltage at the utility frequency is controlled in some embodiments to absorb the re-active power component of load 130. When load 130 consumes power exceeding the maximum power of SA 105 or the rated limiting power of inverter 100, AC current $I_{AC}$ may be controlled to be out-of-phase with respect to the utility grid voltage $V_{AC}$. This way, the utility grid may provide extra power to fulfill the load demand. The output of inverter 100 may still absorb the re-active power component introduced by the load.

Active Power Correction Control

A closed-loop control developed to produce a proper phase-shift of the switching voltage V(VOP)–V(VON) is accomplished by two supporting blocks in certain embodiments. The first support block is GRID-SYNC phase-controlled reference SINE-WAVE generator 150 and the second support block is re-active component detector & integrator 155.

GRID-SYNC phase-controlled SINE-WAVE generator 150 may process two inputs—utility grid voltage $V_{AC}$ and a slowly-varied phase-controlled voltage VPHASE. GRID-SYNC phase-controlled SINE-WAVE generator 150 also produces two outputs, i.e., quadrature sinusoidal signal VCOS and pure SINE-WAVE reference signal SINE_AC. Through steering logic PWM switching driver 190, the inverter controller commands full-bridge switching network 115 to output two switching states of the switched input voltage (+$V_{IN}$ and -$V_{IN}$) having the same fundamental frequency as the utility frequency.

Full-bridge switching network 115 in some embodiments is switched in a PWM fashion as commanded by the PWM signal. The PWM signal may be outputted from SINE_WAVE regulation controller 185. For example, during each odd half of the utility frequency period (e.g., when SINE_AC is positive), full-bridge switching network 115 may produce a positive output voltage (or V(VOP,VON)=+$V_{IN}$) for a period that is relatively longer than that of a negative output voltage (V(VOP,VON)=-$V_{IN}$). This way, the inverter output may deliver a positive voltage of the sinusoidal profile. The sinusoidal profile of positive value, for example, is equivalent to a switching duty ratio of greater than 50 percent in every switching period.

In another example, during each even half of the utility frequency period (e.g., when SINE_AC is negative), full-bridge switching network 115 may produce a positive output voltage (or V(VOP,VON)=+$V_{IN}$) for a period that is relatively shorter in duration than that of a negative output voltage (V(VOP,VON)=-$V_{IN}$). This way, the inverter output may deliver the negative voltage of the sinusoidal profile. The sinusoidal profile in this example may be equivalent to a switching duty ratio of less than 50 percent in every switching period. At the switching duty ratio of 50 percent, the full-bridge switching network 115 may produce a 0-V average voltage every switching period.

The pure SINE-WAVE signal, i.e., SINE_AC, may provide a sinusoidal reference voltage to serve as the input to SINE-WAVE regulation controller 185. The quadrature sinusoidal reference signal VCOS may possess a sinusoidal waveform. The sinusoidal waveform possesses a 90-degree phase lead with respect to the utility grid voltage $V_{AC}$. The re-active component detector and integrator 155 may process two input signals—utility grid current $I_{AC}$ and the quadrature sinusoidal reference signal VCOS. Re-active component detector and integrator 155 may deliver the phase-controlled voltage signal VPHASE. The quadrature sinusoidal reference signal VCOS may represent an orthogonal voltage (or a 90-degree phase lead voltage) with respect to the utility grid voltage $V_{AC}$.

Control for Sinusiodal Inverter Output Voltage

In some embodiments, a SINE-WAVE inverter output-voltage regulation subsystem may include full-bridge switching network 115, steering logic PWM switching driver 190, SINE-WAVE regulation controller 185, differential-mode switching voltage V(VOP)–V(VON), and phase-controlled reference SINE-WAVE generator 150. Conventionally, the SINE-WAVE inverter output-voltage regulation subsystem may be part of an innermost control loop. This innermost control loop may require the fastest control dynamics (or the highest control unity-gain bandwidth) to regulate the differential-mode switching voltage V(VOP)–V(VON) and to track the continually-updated sinusoidal profile. Furthermore, this innermost control loop may have a faster response time as compared to any of the three slower outer control loops. The outer control loops may be governed by input-voltage regulation controller 165, inverter input power-limit regulation controller 180, and inverter output-voltage regulation controller 170.

Serving as a commanding reference-voltage signal for the SINE-WAVE voltage regulation controller 185, the SINE_AC signal may include an AC sinusoidal waveform of a fixed amplitude. The AC sinusoidal waveform may be delivered by phase-controlled reference SINE-WAVE generator 150. In some embodiments, phase-controlled reference SINE-WAVE generator 150 may produce a proper phase-shift of SINE_AC signal with respect to the utility grid voltage $V_{AC}$. The error voltage control signal $V_{CON}$ is controlled in some embodiments to change slowly with a negligible AC ripple voltage having a ripple frequency that is twice the utility grid frequency with an average value serving as a command DC voltage. This way, the error voltage control signal $V_{CON}$ may regulate the filtered inverter's output voltage Voy to have a proper AC amplitude of a sinusoidal waveform with negligible harmonic content. The higher the DC value of the error voltage control signal $V_{CON}$, the larger the amplitude of the regulated AC inverter output voltage becomes. The DC value of the error voltage control signal $V_{CON}$ may be controlled by one of three controllers, whichever produces the least control voltage. For example, either of input voltage regulation controller 165, inverter input power-limit regulation controller 180, or the inverter output voltage regulation controller 170 may control the error voltage control signal $V_{CON}$.

Under normal circumstances, when the available peak-power of SA 105 is below the inverter-input limiting power that is preset as a safe threshold within inverter input power-limit regulation controller 180, a Root-Mean-Square (RMS) value of the inverter output voltage Voy is usually below a RMS voltage threshold. The RMS voltage threshold may be internally preset within inverter output voltage regulation controller 170, and diode D1 may be usually in a blocking state (reverse-biased). This may allow input voltage regulation controller 165 to actively regulate the inverter input voltage $V_{IN}$ at a pre-assigned DC voltage that corresponds to the maximum peak-power voltage $V_{MP}$. In some embodiments, the maximum peak-power $V_{MP}$ may be set-point reference voltage $V_{SP}$ or internal reference voltage $V_{REF}$ (through a manual switch SW in FIG. 1).

As soon as the inverter output voltage $V_{OX}$ has an RMS value that is slightly above the preset RMS voltage threshold, inverter output voltage regulation controller 170 actively operates in a linear region to have an output error voltage $V_e$ sufficiently reduced. This causes diode D1 to be forward-biased. This way, the control of the error voltage control $V_{CON}$ is taken over to allow the RMS value of the inverter output voltage $V_{OX}$ to be regulated. This may prevent inverter 100 from being the cause of an excessive over-voltage across the output of inverter 100. When an excessive RMS voltage across the inverter output voltage $V_{OX}$ is caused by the utility grid voltage $V_{AC}$, error voltage control $V_{CON}$ may be reduced to the lowest voltage limit and/or a shut-down signal (/SD) is asserted "low" to effectively shut-down full-bridge switching network 115. To eliminate or significantly remove the harmonic content in the inverter output voltage $V_{OY}$, a harmonic cancellation term may be extracted in some embodiments from the inverter input voltage $V_{IN}$ and included in the reference sinusoidal signal SINE_AC. A more detailed explanation of the harmonic cancellation will be described below.

0-ADC Current Regulation Control for 0-ADC of the Inverter Output Current

During any transient phase, the output current $I_O$ of inverter 100 may inadvertently exhibit a significant DC component for many cycles of the utility frequency. This may occur when there is no active control to ensure that the output current $I_O$ of inverter 100 possesses 0-A of the DC component. To eliminate any DC component in the output current $I_O$ of inverter 100, the 0-ADC regulation controller 175 may produce a counter balance DC offset voltage $V_{OFF}$. The DC offset voltage $V_{OFF}$ may be added to the composite sinusoidal signal SINE_AC*$V_{CON}$ before the total analog control signal (SINE_AC*$V_{CON}$+$V_{OFF}$) is converted into a PWM switching signal within SINE-WAVE regulation controller 185. Consequently, 0-ADC regulation controller 175 may ensure that the output current $I_O$ of inverter 100 possesses an AC component with a zero DC component ($I_{DC}$=0 A). The 0-A DC current regulation feature may prevent magnetic saturation in the isolation transformer 120. Within SINE-WAVE regulation controller 185, the counter balance DC offset voltage $V_{OFF}$ and the controllable scaled sinusoidal voltage signal SINE_AC*$V_{CON}$ are summed together before being converted into the PWM switching signal. The error voltage control $V_{CON}$ may serve as the scaling factor in some embodiments. As the inverter response reaches steady-state, counter balance DC offset voltage $V_{OFF}$ also settles at 0 or a small offset voltage. This provides a steady counter balance correction due to an inadvertent imbalance that may arise in the PWM control circuit such as an accidentally unsymmetrical RAMP signal. The inadvertent imbalance may exist in the inverter power stage, where power semiconductor switches, such as power metal-oxide-semiconductor field-effect transistors (MOSFETs), may have some accidental mismatches in their on-resistances that inadvertently allow more current to flow in one direction than in the other direction. For example, when the counter balance offset voltage $V_{OFF}$ is not included to the system controller, a DC current of either positive or negative value may exist in the utility grid current $I_{AC}$.

Removal of Switching Ripple Out of Inverter Input and Output Currents

In certain embodiments, input EMI filter 110 is connected between the SA 105 and full-bridge switching network 115. Input EMI filter 110 may provide sufficient differential-mode attenuation of inverter input voltage and input current ripple at medium and high frequencies, as well as common-mode attenuation of the conducted-emission at high frequencies. Output EMI filter 125 may provide similar features, and serve as a low-pass filter interfaced between isolation transformer 120 and the utility grid circuit. The utility grid circuit may include the utility grid interfacing inductor $L_{AC}$, load 130, and AC voltage source 135 in some embodiments. Full-bridge switching network 115 may be a PWM-controlled switching bridge driven by four PWM switching signals $V_{GS1}$ to $V_{GS4}$. PWM switching signals $V_{GS1}$ to $V_{GS4}$ may be derived from utility grid voltage $V_{AC}$ via the following circuit blocks: GRID-SYNC phase-controlled SINE-WAVE generator 150, re-active component detector & integrator 155, SINE-WAVE regulation controller 185, and steering logic PWM switching driver 190. In these embodiments, the resulting utility grid current $I_{AC}$ may possess no re-active component with respect to the utility grid voltage $V_{AC}$. In other embodiments, the resulting utility grid current $I_{AC}$ may have its fundamental frequency component that is either in-phase (e.g., when the utility load demand is less than the solar array available power) or out-of-phase (e.g., when the utility load demand is greater than the solar array available power) with respect to the utility grid voltage $V_{AC}$.

In some embodiments, transient energy absorption devices are included within SA 105 or input EMI filter 110 to provide transient voltage suppression from lightning and other induced transients that can be coupled into the SA 105 and the transmission line. The transmission line in some embodiments may be connected between SA 105 and input EMI filter 110. Fuse F1 may provide over-current protection whenever an input over-current event occurs as a result of any failed component within system 100. This may include transient energy absorption devices within input EMI filter 110. The output of full-bridge switching network 115, power inductor L, SA 105, input EMI filter 110, and all of the control circuits are electrically isolated from output EMI filter 125, load 130, utility grid interfacing inductor $L_{AC}$, and AC voltage source 135 by utilizing an isolation transformer 120 and isolated sensing schemes for utility grid current $I_{AC}$, utility grid voltage $V_{AC}$, inverter output current $I_O$, and isolated inverter output voltage $V_{OX}$.

Figure 2:
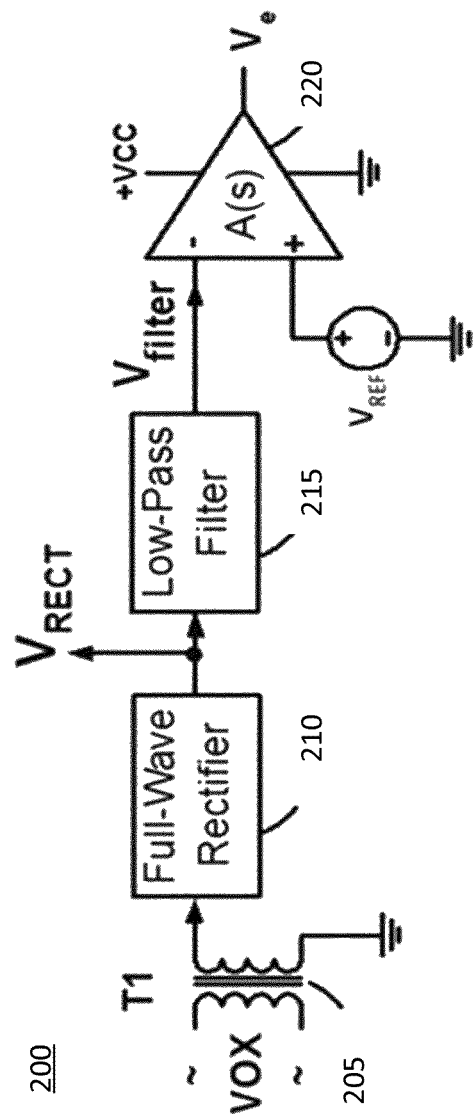
FIG. 2 is a block diagram illustrating an inverter output voltage regulation controller, according to an embodiment of the present invention.

FIG. 2 is a block diagram illustrating an inverter output voltage regulation controller 200, according to an embodiment of the present invention.

In some embodiments, inverter output voltage regulation controller 200 may include a sensed transformer (T1) 205, full-wave rectifier 210, low-pass filter 215, and error amplifier 220. In certain embodiments, error amplifier 220 provides an output error voltage $V_e$. Output error voltage $V_e$ may be an amplified and frequency-compensated differential voltage between the filtered and absolutely-sensed inverter output voltage $V_{filter}$ and the internal reference voltage $V_{REF}$. Also, in certain embodiments, isolation transformer 205 is an isolation and sensing unit for the inverter output voltage $V_{OX}$. The inverter output voltage $V_{OX}$ of transformer 205 is fed through full-wave rectifier 210 in certain embodiments. Full-wave rectifier 210 may deliver the sensed absolute inverter voltage $V_{RECT}$. Low-pass filter 215 may attenuate the AC voltage ripple content out of the sensed absolute inverter voltage $V_{RECT}$ to an acceptable level before feeding the filtered and absolutely-sensed inverter output signal $V_{filter}$ to the inverting input of error amplifier (A(s)) 220. In some embodiments, internal reference voltage $V_{REF}$ may be connected to the non-inverting input of error amplifier.

Figure 3:
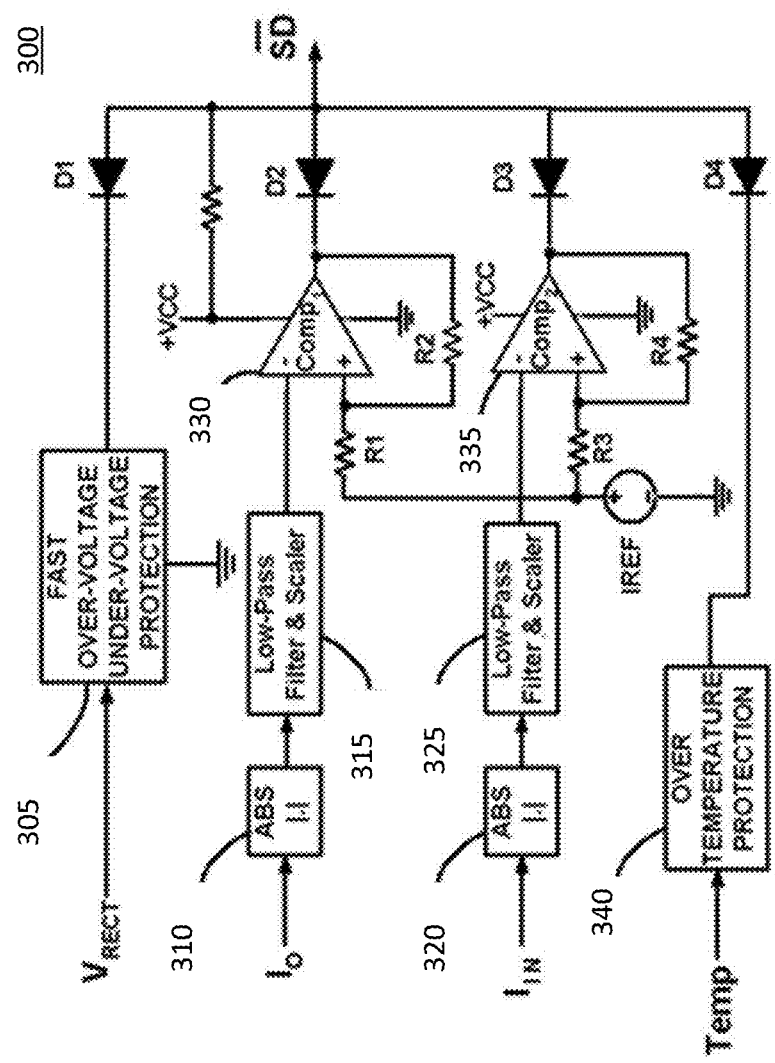
FIG. 3 is a block diagram illustrating an over-voltage, over-current protection, and over-temperature protection controller, according to an embodiment of the present invention.

FIG. 3 is a block diagram illustrating an over-voltage, over-current protection, and over-temperature protection controller (or controller) 300, according to an embodiment of the present invention. In some embodiments, controller 300 provides an asserted-low voltage output during one out of five possible abnormal conditions. This protection low-voltage output of controller 300 may be induced by an inverter output over-voltage, an inverter output under-voltage, an inverter input over-current, an inverter output over-current, or an inverter over-temperature. One of these conditions may occur within the full-bridge switching network (see FIG. 1). For example, one of the active pull-down diodes D1, D2, D3 and D4 may pull the shut-down voltage signal SD down, subsequently causing the steering logic PWM switching driver to shut off PWM switching signals $V_{GS1}$, $V_{GS2}$, $V_{GS3}$, and $V_{GS4}$ to be in their turn-off state (or 0 V).

In certain embodiments, fast over-voltage/under-voltage protection circuit 305 may process a sensed absolute inverter output voltage $V_{RECT}$ and provide an active pull-down through diode D1. The sensed inverter output current $I_O$ is rectified and scaled by the absolute value circuit 310. The sensed inverter output current $I_O$ is also low-pass filtered by low-pass filter 315 after sensed inverter output current $I_O$ is rectified and sensed. The filtered sensed inverter current $I_O$ may then be fed to the inverting input of voltage comparator 330, which may provide an active pull-down through diode D2.

Similarly, sensed inverter input current $I_{IN}$ may be rectified by absolute value circuit 320 and low-pass filtered by low-pass filter (LPF) 325 after sensed inverter input current $I_{IN}$ is rectified and sensed. The filtered sensed inverter input current $I_{IN}$ can then be fed to the inverting input of voltage comparator 335, which may provide an active pull-down through diode D3.

The sensed temperature voltage signal Temp in some embodiments may be processed through over-temperature protection circuit 340. Over-temperature protection circuit 340 may provide an active pull-down through diode D4.

Figure 4:
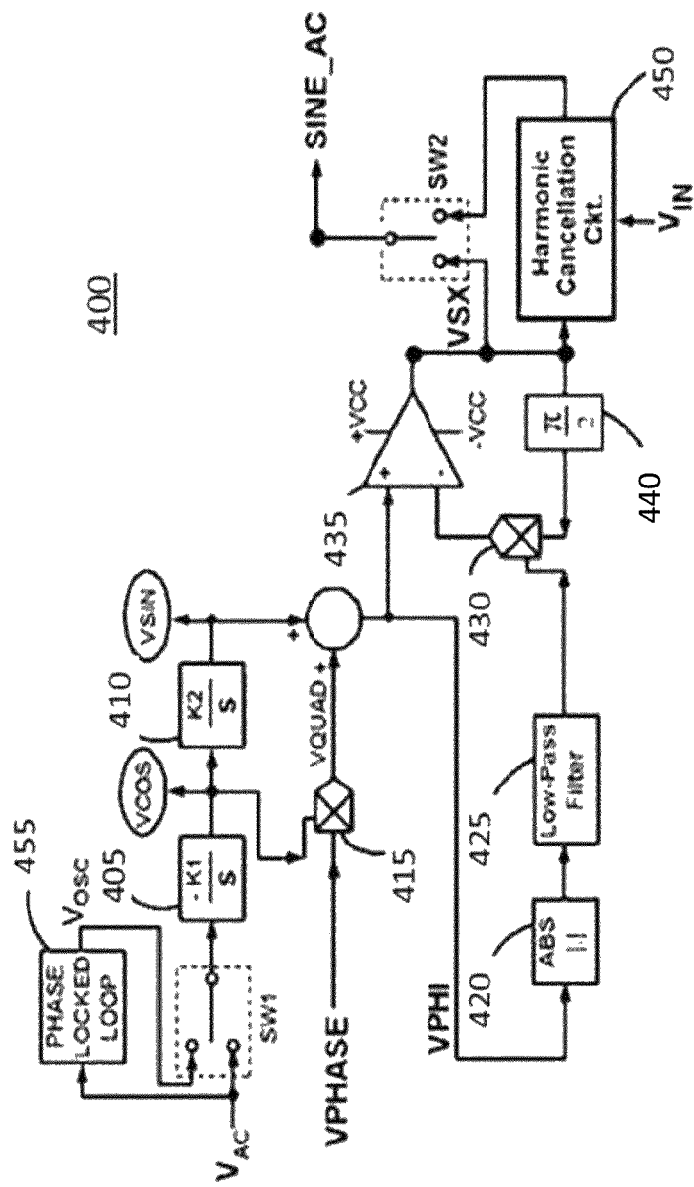
FIG. 4 is a block diagram illustrating a grid-sync phase-shifted SINE-WAVE generator, according to an embodiment of the present invention.

FIG. 4 is a block diagram illustrating a grid-sync phase-shifted SINE-WAVE generator 400, according to an embodiment of the present invention. In some embodiments, grid-sync phase-shifted SINE-WAVE generator 400 may accept two analog input signals, and deliver two output signals. The two analog input signals may include utility grid voltage $V_{AC}$ and phase controlled voltage VPHASE, and the two output signals may include a quadrature sinusoidal voltage signal VCOS and the sinusoidal reference signal SINE_AC. Utility grid voltage $V_{AC}$ may be fed to a two-stage integrators 405, 410 for reproducing two orthogonal sinusoidal signals—VSIN and VCOS. VSIN signal may serve as an in-phase component sinusoidal signal and VCOS signal may serve as a quadrature sinusoidal signal with a 90-degree phase-lead with respect to VSIN signal. This way, the VSIN signal may be in-phase with respect to the utility grid voltage $V_{AC}$.

Integrator (or inverting integrator circuit) 405 may be realized by an inverting OP-AMP circuit associated with an R-C network. The R-C network may include one input resistor and one feedback capacitor. Integrator 410 may be similar to integrator 405 in some embodiments, with an additional voltage inverter to realize integrator 405 as a non-inverting integrator.

Input signal, VPHASE, may be a slow changing phase-control signal that serves as an adjustable multiplier constant to a quadrature sinusoidal voltage signal VCOS representing the quadrature voltage-component. The utility grid voltage $V_{AC}$ and in-phase component sinusoidal signal VSIN, however, represent the in-phase voltages. The product of input signal VPHASE and quadrature-sinusoidal signal VCOS may result in another sinusoidal signal VQUAD. The in-phase component sinusoidal signal VSIN and the adjusted quadrature sinusoidal signal VQUAD are summed together to form a composite signal VPHI. The composite signal VPHI may include a magnitude of the quadrature component that causes a proper phase-shift of the reference SINE_AC signal with respect to the utility grid voltage $V_{AC}$.

SINE_AC signal may have a constant amplitude in some embodiments regardless of its phase shift with respect to utility grid voltage $V_{AC}$. Regulation of SINE_AC signal at a fixed amplitude of 1 V may require five functional blocks inter-connected together to properly convert the phase-shifted sinusoidal signal VPHI to be a VSX signal. In some embodiments, the phase-shifted sinusoidal signal VPHI may have an un-fixed amplitude and the VSX signal may have a fixed amplitude sinusoidal signal that is perfectly in-phase with VPHI signal.

Multiplier 415 in some embodiments produces quadrature sinusoidal signal VQUAD as the product between VPHASE and VCOS signals. PLL 455 may deliver a continuous sinusoidal signal $V_{OSC}$, which is controlled to be in phase with the utility grid voltage $V_{AC}$. PLL 455 may offer a continuously sustained sinusoidal waveform of signal $V_{OSC}$ regardless of the presence or absence of the utility grid voltage $V_{AC}$.

In certain embodiments, the five functional blocks are an input absolute value circuit 420, a low-pass filter 425, a multiplier 430, an OP-AMP 435, and a scale-factor gain block 440 having gain value of π/2. The non-inverting input of OP-AMP 435 may be connected to VPHI, whereas its inverting input may be connected to the output of multiplier 430.

In some embodiments, the output of multiplier 430 may deliver the product of a DC component voltage and the feedback sinusoidal signal having amplitude of π/2 V. The DC component voltage may be extracted from VPHI signal using input absolute value 420 and LPF 425. Consequently, the output of OP-AMP 435, VSX or SINE_AC, delivers in this embodiment a sinusoidal signal with 1-V amplitude that is always in phase with VPHI signal. OP-AMP 435 is biased using a double-ended power supply +VCC and −VCC to produce SINE_AC signal in some embodiments.

In some embodiments, through a SPDT switch SW2, instead of directly delivering the 1-V amplitude phase-shifted sinusoidal signal VSX as SINE_AC output signal by grid-sync phase-shifted SINE-WAVE generator 400, VSX may be pre-processed by harmonic cancellation circuit 450 to include a harmonic-cancellation voltage extracted from the inverter input voltage $V_{IN}$. This may result in the elimination or significant reduction of harmonic contents within the inverter output voltages Vox and Voy. Consequently, SINE_AC signal may be the output of harmonic cancellation circuit 450 shown in FIG. 4 or 500 shown in FIG. 5.

Figure 5:
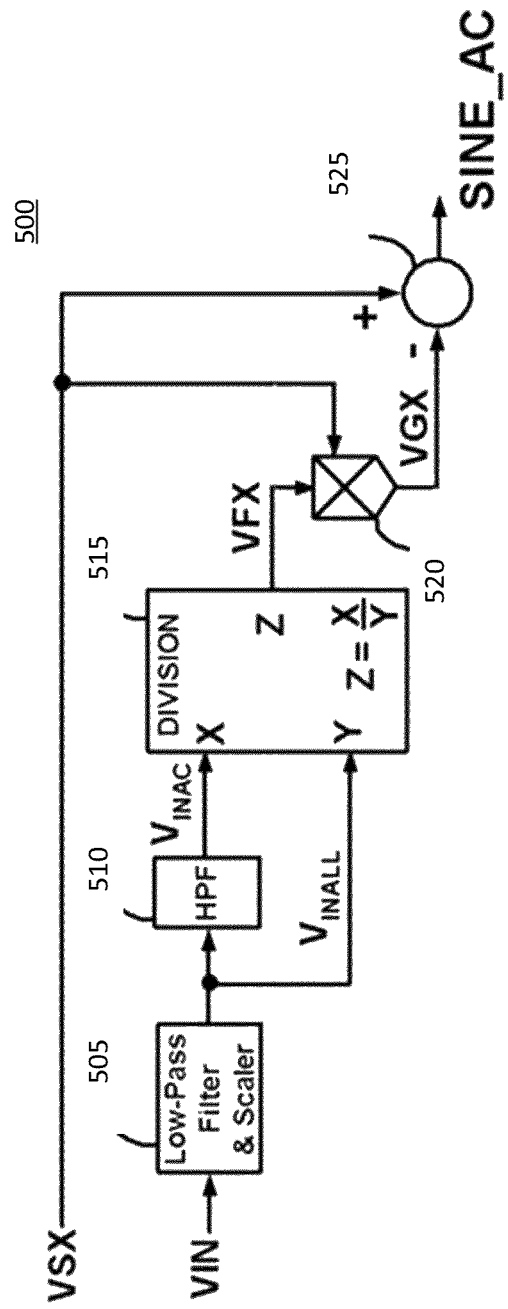
FIG. 5 is a block diagram illustrating a harmonic cancellation circuit, according to an embodiment of the present invention.

FIG. 5 is a block diagram illustrating a harmonic cancellation circuit 500, according to an embodiment of the present invention. In certain embodiments, harmonic cancellation circuit 500 include a LPF and scaler 505, a high-pass filter (HPF) 510, a divisor (or division) circuit 515, a multiplier circuit 520, and a subtractor circuit 525.

In some embodiments, for example, LPF and scaler 505 may remove noise at switching-frequency and beyond, scale down the sensed input voltage without causing distortion to its AC ripple voltage, and deliver the scaled-down input voltage $V_{INALL}$. HPF 510, for example, may then extract the AC ripple voltage out of the scaled-down input voltage $V_{INALL}$, and deliver the sensed input ripple voltage $V_{INAC}$. The divisor circuit 515 may then compute the voltage ratio between the AC ripple and the total scaled-down voltage $V_{INAC}/V_{INALL}$, and deliver the ratio voltage signal VFX. Subsequently, multiplier circuit 520 may compute the product between the ratio voltage VFX and the 1-V phase-shifted reference sinusoidal signal VSX, and deliver the product voltage VGX (VGX=VFX*VSX). Finally, subtractor circuit 525 may subtract the product voltage VGX from the phase-shifted reference sinusoidal signal VSX, and deliver a compensated sinusoidal signal SINE_AC. The compensated sinusoidal signal SINE_AC may include the harmonic-cancellation voltage content in addition to its 1-V pure sinusoidal waveform in some embodiments.

Applied in one or more embodiments of inverter control, the compensated SINE_AC signal may be represented as $$SINE_{AC}=\sin(\omega t+\emptyset)(1-V_{INAC}/V_{INALL}) \quad \text{Equation (1)}$$

where $$V_{INALL}=k*V_{IN}=k(V_{INDC}+V_R) \quad \text{Equation (2)}$$

$$V_{INAC}=k*V_R \quad \text{Equation (3)}$$

$$V_{INAC}/V_{INALL}=V_R/V_{IN} \quad \text{Equation (4)}$$

$$|V_R/V_{IN}|<1 \quad \text{Equation (5)}$$

where ω is angular frequency of the utility grid voltage $V_{AC}$, t is time in seconds, k is scaling factor of LPF and scaler 505, $V_R$ is the total AC-content voltage, $V_{IN}$ is the total inverter input voltage, $V_{INALL}$ is the sensed inverter input voltage after being scaled down by a factor k, and $V_{INAC}$ is the sensed inverter AC-content voltage which is k*$V_R$.

Figure 6:
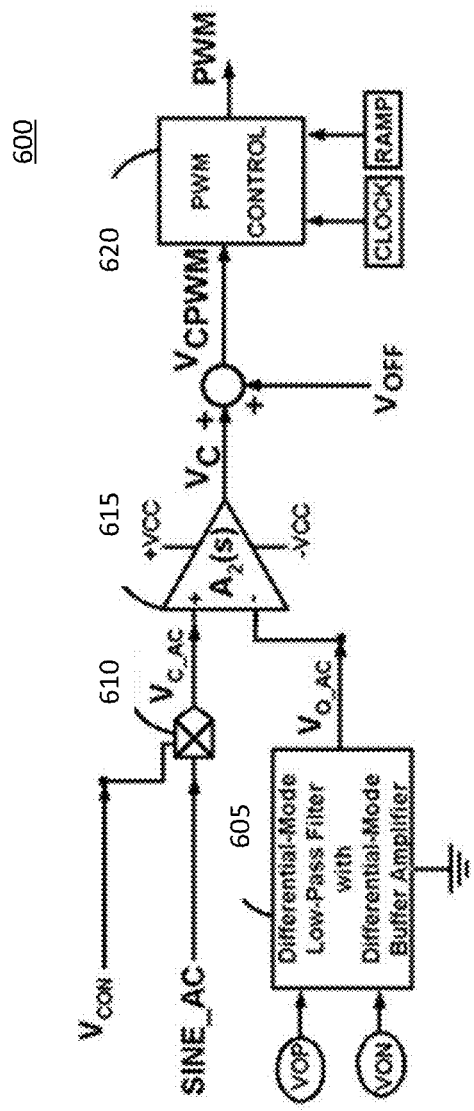
FIG. 6 is related art illustrating a pure SINE-WAVE regulation controller.

FIG. 6 is related art illustrating a pure SINE-WAVE regulation controller 600. Pure SINE-WAVE regulation controller 600 includes five inputs and provides a PWM switching signal as the output. The first four input signals are error voltage control $V_{CON}$, the sinusoidal reference signal SINE_AC, first PWM switching voltage VOP, which is the output of one switching-leg within the full-bridge switching network, and the second PWM switching voltage VON, which is the output of the full-bridge switching power devices. Differential low-pass filter and differential-mode buffer amplifier 605 accepts the different-mode voltage across VOP and VON nodes and delivers the filtered AC voltage $V_{O\_AC}$. Within Differential low-pass filter and differential-mode buffer amplifier 605, the two-state switching voltage V(VOP,VON) is fed through a LPF to remove most of switching ripple content at the inverter switching frequency, and delivers a moderately filtered and scaled-down inverter AC output voltage $V_{O\_AC}$. This way, the AC output voltage $V_{O\_AC}$ signal represents the sensed inverter output voltage, where the sinusoidal voltage profile is regulated by the commanding reference signal $V_{C\_AC}$ having an AC sinusoidal waveform. The commanding reference signal $V_{C\_AC}$ having a sinusoidal waveform is a mathematical product of two signals—$V_{CON}$ and SINE_AC—serving as the inputs of the multiplier 610.

In some embodiments, SINE-WAVE regulation error amplifier $A_2(s)$ 615 provides amplification and frequency-compensation to the voltage difference between AC commanding reference $V_{C\_AC}$ and AC output voltage $V_{O\_AC}$ signals, and delivers the amplified voltage difference as an analog output voltage $V_C$. PWM control 620 may then convert the analog output voltage $V_C$ into the PWM switching signal.

The pulse-width of the PWM signal is controlled as a function of sinusoidal, and possesses the same switching frequency as that of the CLOCK timing signal. The active pulse of the PWM signal has a leading-edge transition when the CLOCK signal is active for a brief duration every switching period to cause the state of PWM signal to change from inactive to active pulse state. When the symmetrical RAMP signal (having 0-V Dc average) increases to intercept the analog output voltage $V_C$, PWM control 620 may terminate the active state of the PWM pulse, causing the PWM signal to produce the trailing-edge transition. The RAMP signal linearly increases from its trough voltage to its peak voltage, and is reset back to the trough voltage at the same time when CLOCK signal is active. The clock signal has very short duration of its active state as compared to its switching period to ensure that the PWM signal is able to produce its minimum pulse-width as close to zero duty-ratio as needed.

SINE-WAVE regulation controller 600 possesses a high-gain amplifier 615 having a transfer function $A_2(s)$, and requires a proper design of the frequency-compensation network within high-gain amplifier 615 to achieve the overall closed loop stability of robust performance. Once high-gain amplifier 615 is properly designed, SINE_AC signal needs to have a fixed-amplitude pure sinusoidal waveform without any need to include a harmonic cancellation voltage content. See, for example, harmonic cancellation circuit 450 of FIG. 4, which is by-passed by switch SW2.

When the inverter input voltage $V_{IN}$ includes low impedance or sufficient filtering capacitance $C_{IN}$, and supplies a low power into the inverter circuit, the waveform of the amplifier output signal $V_C$ may possess most of the sinusoidal profile with negligible deviation from its ideal sinusoidal profile. When the inverter processes higher power toward its designed power rating, the ripple voltage superimposed on the inverter input voltage $V_{IN}$ becomes so significant that the amplifier output signal $V_C$ no longer retains its close-to-ideal waveform of the sinusoidal profile.

Consequently, the switching PWM signal may have its pulse-width profile significantly deviated from the ideal rectified sinusoidal profile. Since, the DC input power source is not an ideal voltage source, and includes a significant sourcing impedance, the far-from ideal rectified sinusoidal profile of PWM signal also creates a localized transient oscillation within the waveform of the PWM switching output voltage, V(VOP)–V(VON), while the pure SINE-WAVE regulation controller 600 asserts its control effort to regulate the output voltage to its ideal sinusoidal profile $V_{C\_AC}$.

The practical amplifier has many imperfections. Some of which include a limiting slew rate of its output voltage swing, a non-ideal phase-gain characteristics in addition to the significant amount of AC voltage ripple superimposed on the DC input voltage $V_{IN}$, and the localized oscillation within the PWM switching output voltage waveform can take longer time to be dampened out. This causes more distortion from the ideal sinusoidal profile of the inverter output voltage. The localized oscillation of significant amount can also trigger an input over-current protection or an output over-current protection to interfere the SINE-WAVE regulation, leading to an unexpected waveform of the inverter output voltage that not only fails to reflect the anticipated sinusoidal profile but also causes a system malfunction. This is one of design difficulties when using high-gain amplifier $A_2(s)$ 615 to accurately control the differential-mode sensed inverter voltage $V_{O\_AO}$ to track the sinusoidal profile $V_{O\_AO}$.

Figure 7:
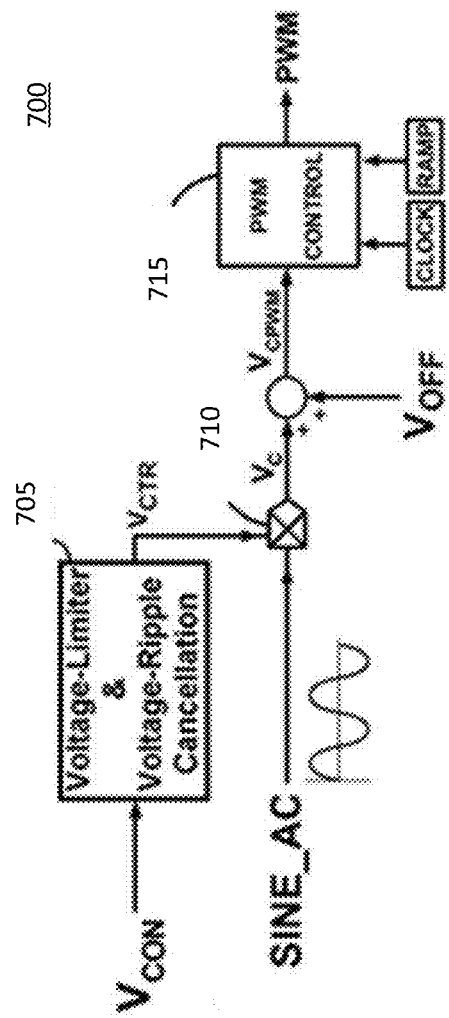
FIG. 7 is a block diagram illustrating a pure SINE-WAVE regulation controller, according to an embodiment of the present invention.

To resolve the localized transient oscillation in the inverter output voltage waveform, high-gain amplifier $A_2(s)$ 615 is removed so that the tight closed-loop regulation of the sinusoidal waveform is no longer needed. For example, FIG. 7 is a block diagram illustrating a pure SINE-WAVE regulation controller 700, according to an embodiment of the present invention. In some embodiments, SINE-WAVE regulation controller 700 does not need the feedback of the inverter switching output voltage, V(VOP)–V(VON), for the production of a PWM signal of a sinusoidal profile. Instead, an adjustable sinusoidal profile of the PWM signal already supports the sinusoidal waveform production of the inverter output voltage.

In these embodiments, SINE-WAVE regulation controller 700 may include voltage-limiter and voltage-ripple cancellation (or voltage limiter) 705, multiplier 710, and PWM control 715 to produce PWM switching signal. The PWM switching signal includes a pulse-width programmed to possess a sinusoidal profile. The sinusoidal profile may follow the SINE-WAVE reference signal SINE_AC with a scaling factor proportional to the slow varying error control voltage $V_{CON}$. Voltage limiter 705 in these embodiments may ensure that the varying error control voltage $V_{CON}$ is limited to at least 0 VDC and does not exceed a pre-assigned positive voltage. For example, voltage limiter 705 limits the varying error control voltage $V_{CON}$ such that the maximum duty-ratio of the PWM signal does not exceed 100 percent or any designated value of its lower maximum limit (of less than 100 percent).

This way, the output PWM signal is guaranteed to include a complete sinusoidal profile $V_{CPWM}$ regardless of the line and load condition. The sinusoidal profile $V_{CPWM}$ is not guaranteed to be always achievable when employing SINE-WAVE regulation controller 600 of FIG. 6 using high-gain amplifier $A_2(s)$ 615. In FIG. 6, it should be appreciated that noise and imperfections exist within practical amplifiers causing the high-gain amplifier output signal to easily deviate from its ideal sinusoidal profile. In contrast, there is no need to have a frequency-compensation network for the multiplication of the two input signals SINE_AC and $V_{CON}$ shown in FIG. 7, as long as the inverter input voltage at full power exhibits a negligible content of AC ripple voltage. The fundamental frequency of the AC ripple voltage superimposed on inverter input voltage $V_{IN}$ is twice of the utility frequency in all embodiments.

Pure SINE-WAVE regulation controller 700 in some embodiments is simpler and much easier to design and build. Furthermore, pure SINE-WAVE regulation controller 700 includes a robust system stability performance dependent on its outer slower control loop associated with any of the three controllers. See, for example, FIG. 1, which shows input voltage regulation controller 165, the inverter input power-limit regulation controller 180, or the inverter output voltage regulation controller 170.

In some embodiments, two input signals $V_{CON}$ and SINE_AC may be needed. The simple and robust SINE-WAVE regulation controller 700 in some embodiments may not remove higher harmonic content, such as the third-harmonic content, out of the inverter output voltage waveform due to the presence of a significant AC ripple voltage superimposed on the DC operating voltage across the inverter input. In certain embodiments, the AC voltage ripple (having amplitude voltage $V_R$) is superimposed on the DC operating input voltage $V_{IN}$, and fed to the inverter input. The AC voltage ripple is the cause of the third harmonic content in certain embodiments existing in the inverter output voltage. Usually amplitude voltage $V_R$ is designed to be 5 percent or less of the DC input voltage at the inverter rated power.

According to some fundamental mathematical derivations, the amplitude voltage $V_R$ of the third harmonic content is equal to one half of the product between amplitude voltage $V_R$ and the maximum duty ratio $d_{MAX}$. The maximum duty ratio $d_{MAX}$ may be a peak PWM duty-ratio occurring during a line and load voltage condition. In other words, using the input signals for SINE-WAVE regulation controller 700, the third harmonic content can be up to 2.5 percent of the fundamental voltage amplitude. This may be acceptable for SINE-WAVE regulation controller 700.

Further mathematical derivation and introduction of some extra cancellation mathematical terms allows the third harmonic content to be eliminated. The elimination of the third harmonic voltage component may utilize a feed-forward harmonic cancellation term, which may be implemented and added into the phase-shifted SINE-WAVE generator. See, for example, FIGS. 4 and 5. The feed-forward harmonic-cancellation term is realized as a small voltage signal $V_{GX}$, which may be subtracted from the phase-shifted reference sinusoidal profile voltage VSX to form a corrected sinusoidal profile voltage SINE_AC before subsequently converting the composite voltage signal $V_{CON}$*SINE_AC into the PWM switching signal as shown in FIG. 7. In some embodiments, as shown in FIG. 7, PWM control 715 may convert the composite voltage signal $V_{GX}$ to the PWM switching signal.

Returning to FIG. 5, to realize the feed-forward harmonic-cancellation voltage (composite voltage signal) $V_{GX}$ in harmonic cancellation circuit 500, the inverter input voltage $V_{IN}$ is used as the third input signal in some embodiments for the phase-shifted SINE-WAVE generator 150 (see FIG. 1). In certain embodiments, input voltage $V_{IN}$ is sensed and scaled down. Low pass filter 505 may provide low pass filtering on the scaled input voltage $V_{IN}$ to remove the switching ripple at the inverter switching frequency and beyond. The harmonic AC voltage ripple (from the second harmonic or higher harmonic frequencies) superimposed on the scaled and filtered input voltage may be preserved in both amplitude and phase with respect to the DC operating voltage of the sensed and scaled input voltage. The harmonic AC ripple voltage, $V_{INAC}$, may then be extracted out of the total sensed input voltage without distortion of its AC magnitude and phase. See, for example, high pass filter 510 of FIG. 5.

Divisor circuit 515 may compute the ratio of the sensed AC ripple voltage to the total sensed input voltage, and output the computed ratio as a rational voltage VFX. Consequently, the product between the rational voltage VFX and the phase-shifted reference sinusoidal profile voltage VSX may be computed by the multiplier circuit 520 to output the product result as the feed-forward harmonic-cancellation voltage VGX. Therefore, for a significant AC ripple voltage superimposed on the inverter input voltage, the simple SINE-WAVE regulation controller 700 of FIG. 7 may need the compensated sinusoidal reference SINE_AC to mostly eliminate the third harmonic content out of the inverter output voltage waveform. It should be appreciated that the compensated sinusoidal reference SINE_AC may include the harmonic-cancellation voltage as an optional design choice.

Without the optional harmonic-cancellation circuit shown in FIGS. 4 and 5, the inverter may still perform with the third harmonic content of up to 2.5 percent of the inverter output voltage for up to 5 percent of the inverter input ripple voltage. This feed-forward harmonic-cancellation technique may allow the inverter to tolerate a significantly higher input voltage ripple. This implies that the input filtering capacitor $C_{IN}$ (see FIG. 1) can be made smaller size to tolerate higher voltage ripple being primarily observable at twice the utility frequency, e.g., 120-Hz for 60-Hz utility.

Unlike SINE-WAVE regulation controller 700 of FIG. 7, SINE-WAVE regulation controller 600 of FIG. 6 includes a high-gain controller that tightly regulates the inverter voltage waveform to be sinusoidal. Despite the ideal zero-harmonic content, which may be achievable out of the first controller 200, the high-gain SINE-WAVE regulation controller 600 of FIG. 6 is more complex (and less practical) to design than the low-gain SINE-WAVE regulation controller 700 of FIG. 7. In certain embodiments, the fed-back differential switching voltage V(VOP,VON) is no longer needed, and is absent in the diagram shown in FIG. 7, or in further embodiments, the active high-bandwidth closed-loop regulation of the switching voltage V(VOP,VON) waveform is not required.

Returning to FIG. 7, another cause of harmonic content to exist in the inverter output voltage is the residual harmonic content within the control voltage $V_{CON}$, particularly the AC ripple voltage at twice the utility frequency. As the product of control voltage $V_{CON}$ and SINE_AC signals is computed by multiplier 710, the second harmonic content existing in control voltage $V_{CON}$ is modulated into the product of the two signals—$V_{CON}$*SINE_AC—causing the output of the sinusoidal profile $V_{CPWM}$ of multiplier 710 to include the harmonic content. This harmonic content cannot be cancelled by the harmonic-cancellation circuit previously described and shown in FIGS. 4 and 5. Thus, it may be necessary to remove or further reduce the AC ripple voltage, particularly the second harmonic content, out of error voltage control $V_{CON}$ so that the processed control voltage $V_{CON}$ signal is free from the harmonic content before being multiplied with SINE_AC signal. Using this logic, voltage limiter & voltage ripple cancellation circuit 705 may include a voltage-ripple cancellation circuit in addition to the voltage-limiter that was previous mentioned.

Figure 8:
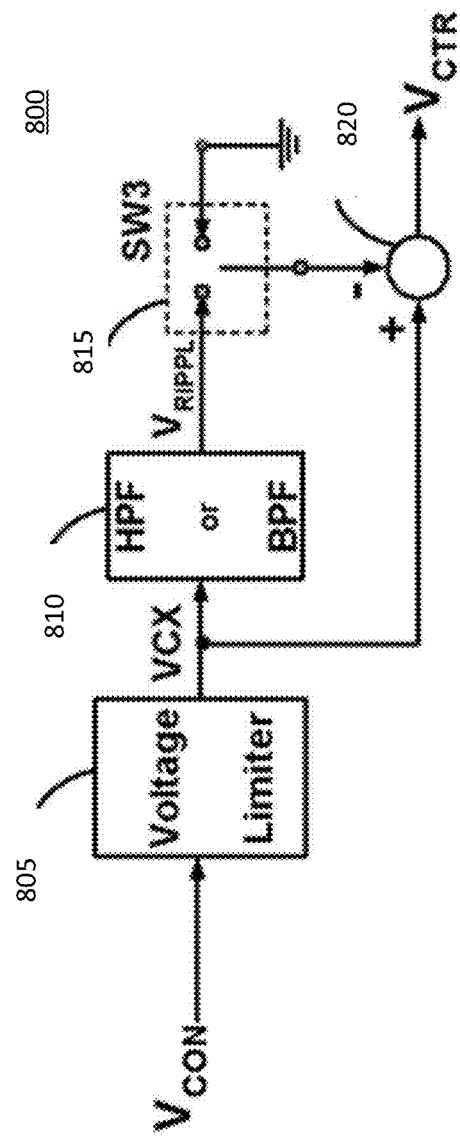
FIG. 8 is a block diagram illustrating a voltage-limiter and voltage-ripple cancellation circuit, according to an embodiment of the present invention.

FIG. 8 is a block diagram illustrating a voltage-limiter and voltage-ripple cancellation circuit 800, according to an embodiment of the present invention. In this embodiment, voltage-limiter and voltage-ripple cancellation circuit 800 may deliver the ripple-free control signal $V_{CTR}$ out of error voltage control $V_{CON}$.

In such an embodiment, voltage-limiter 805 may accept control voltage $V_{CON}$ as its input, and deliver a total control signal VCX as its output with the limited range of the output control voltage. The output control voltage may be kept to be non-negative and limited to a permissible maximum preventing the subsequently generated PWM signal from being saturated at 100 percent duty cycle.

Next, HPF circuit 810 may remove the DC and very low frequency components out of total control signal VCX, and deliver a ripple voltage $V_{RIPPL}$ as the output. HPF circuit 810 in some embodiments may be replaced with a band-pass filter. The band-pas filter may tune the center frequency to be twice the utility frequency and its peak gain at the center frequency is unity. In this manner, ripple voltage $V_{RIPPL}$ may retain the AC ripple voltage content in both phase and magnitude, and more specifically, may retain the AC ripple voltage at twice the utility frequency when the band-pass filter circuit is used instead of the HPF circuit 810. Switch SW3 815 may provide an option to either include or exclude this ripple cancellation method. Subtractor 820 may in some embodiments subtract ripple voltage $V_{RIPPL}$ from the total control signal VCX so that the resulting control signal $V_{CTR}$ is free from the AC ripple voltage.

Figure 9:
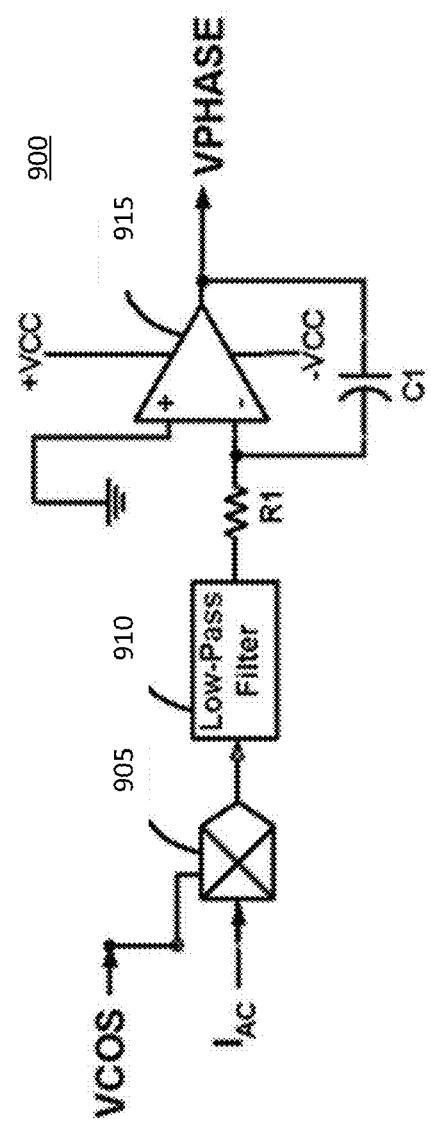
FIG. 9 is a block diagram illustrating a grid-current re-active component detector and integrator, according to an embodiment of the present invention.

FIG. 9 is a block diagram illustrating a grid-current re-active component detector and integrator 900, according to an embodiment of the present invention. In this embodiment, grid-current re-active component detector and integrator 900 may process two input signals—the sensed utility grid current $I_{AC}$ and the quadrature-component signal VCOS. Grid-current re-active component detector and integrator 900 may deliver a single output signal VPHASE.

In some embodiments, grid-current re-active component detector and integrator 900 includes a multiplier 905, a LPF 910, and an integrator 915. Multiplier 905 may compute the product of the input signals. The product of the input signals is processed by LPF 910 to extract the DC component from the product of the output signal. When the product (i.e., VCOS×$I_{AC}$) has 0 V as its DC component, the sensed utility grid current $I_{AC}$ is either in-phase or out-of-phase with the utility grid-voltage $V_{AC}$ without any quadrature component. This may cause integrator 915 to hold its output voltage VPHASE at its existing value.

On the other hand, when the product of the output signal has a non-zero DC component, integrator 915 continues its time-integration of the LPF 910 output signal so that the DC component of the product is regulated at 0 V. The non-zero DC component within the product may occur as a result of transient changes in the phase of the utility-grid voltage or the load power factor (more or less re-active than that before the change). This causes the non-zero DC component within the product to be detected such that the output signal VPHASE is increased or decreased to a different voltage. This produces a sufficient phase-correction to the inverter output voltage that eventually restores the 0-V DC component of multiplier 905 output signal.

Figure 10:
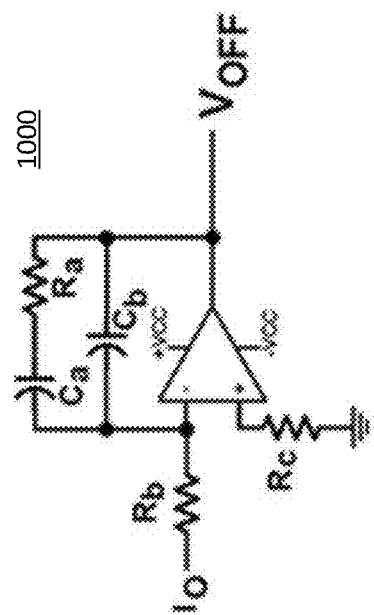
FIG. 10 is a circuit diagram illustrating a zero average-current (0-ADC) regulation controller, according to an embodiment of the present invention.

FIG. 10 is a circuit diagram illustrating a zero average-current controller (0-ADC) regulation controller 1000, according to an embodiment of the present invention. In some embodiments, 0-ADC regulation controller 1000 may ensure 0-ADC of the inverter output current $I_O$ during a steady state. 0-ADC regulation controller 1000 may provide an integral-lead compensation to the feedback inverter output current signal $I_O$, and deliver the counter balance offset signal $V_{OFF}$. The counter balance offset signal $V_{OFF}$ may be subsequently added to the composite sinusoidal signal within SINE-WAVE regulation controller 700 shown in FIG. 7.

Figure 11:
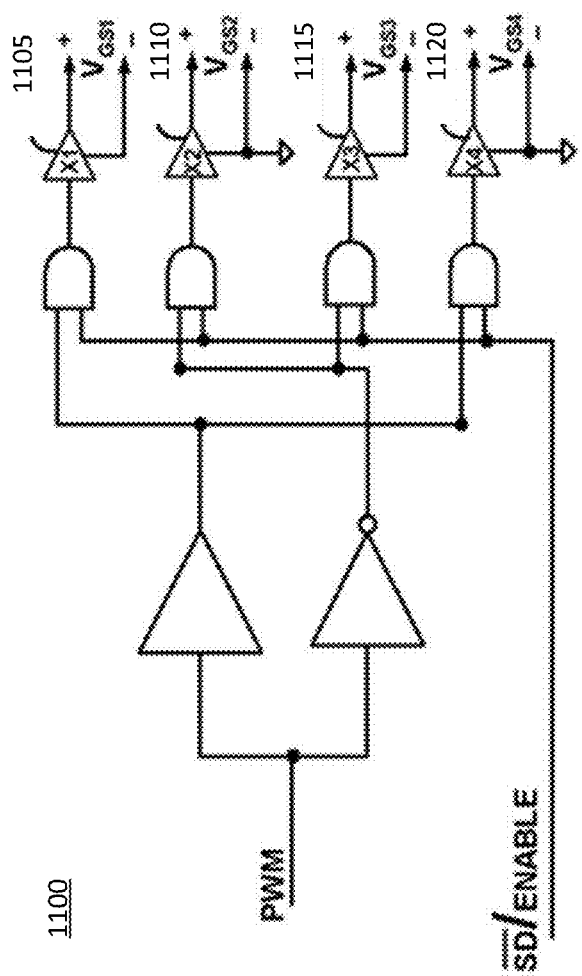
FIG. 11 is a circuit diagram illustrating a steering logic pulse width modulation (PWM) switching driver circuit, according to an embodiment of the present invention.

FIG. 11 is a circuit diagram illustrating a steering logic PWM switching driver 1100, according to an embodiment of the present invention. In some embodiments, steering logic PWM switching driver 1100 may process two input signals—PWM and SD. Steering logic PWM switching driver 1110 may also deliver PWM switching signals—$V_{GS1}$, $V_{GS2}$, $V_{GS3}$, and $V_{GS4}$.

In some embodiments, four logical-AND operations and one logical-NOT operation may exist within PWM switching driver 1100. Two parallel paths of logical-AND may produce two identical logic-switching functions, PWM*(/SD). The two identical logic-switching functions may control respective diagonal pairs of PWM switching signals $V_{GS1}$ and $V_{GS4}$. The remaining two parallel paths of logical-AND operation share the same logical-NOT operation, and produce two identical logic-switching functions, (/PWM)*(/SD). The two identical logic-switching functions may control the other diagonal pairs of PWM switching signals, $V_{GS2}$ and $V_{GS3}$.

In some embodiments, the four gate-drive signals are commonly controlled by the SD signal. When the SD signal is in a shut-down state (="0" logic state), all the PWM switching signals ($V_{GS1}$ to $V_{GS4}$) are in a shut-down state (SD=logic "0"), providing all 0-V driving voltages to turn off all the four controllable MOSFET switches within the full-bridge switching power devices. See, for example, FIG. 1.

Figure 12:
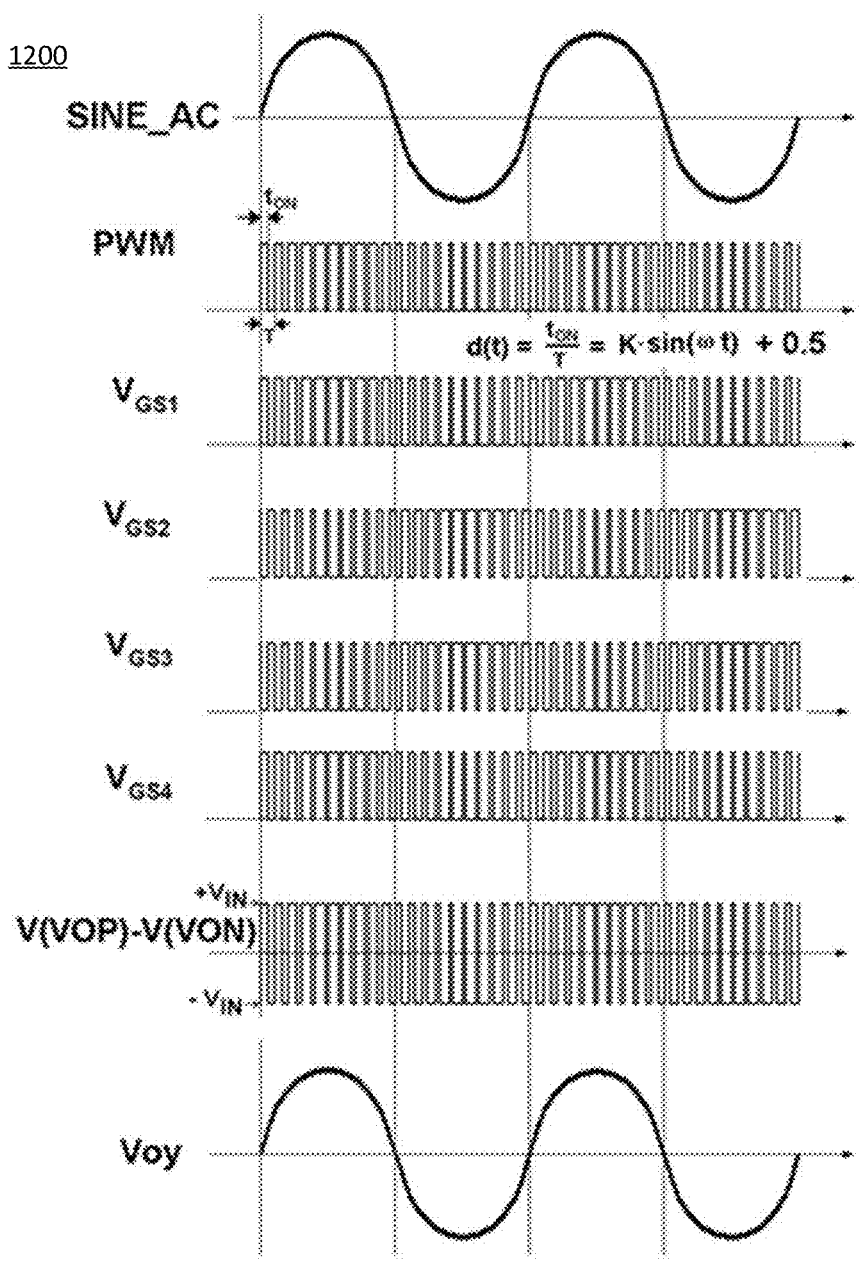
FIG. 12 illustrates waveforms of key signals or voltages, according to an embodiment of the present invention.

FIG. 12 illustrates waveforms 1200 of key signals or voltages, according to an embodiment of the present invention. In this embodiments, waveforms 1200 are represented as a function of time to show how PWM switching driver 190 of FIG. 1 produces gate drive signals $V_{GS1}$ ... $V_{GS4}$ with respect to input signals PWM and reference sinusoidal signal SINE_AC under normal mode of operation, i.e., when the shut-down state SD is equal to logic "1".

In FIG. 12, the PWM signal may deliver a train of switching pulses. The pulses may have a pulse-width that is varied in time as a sinusoidal function, and is proportional to the reference signal SINE_AC. When the shut-down signal SD is not in the shut-down state, i.e., SD is equal to logic "1", PWM switching signals $V_{GS1}$ and $V_{GS4}$ are paired together with the same logic state as PWM, i.e. $V_{GS1}=V_{GS4}$=PWM. In such embodiments, PWM switching signals $V_{GS2}$ and $V_{GS3}$ are paired with the same logic state as the inverted PWM signal, i.e., $V_{GS2}=V_{GS3}$=(/PWM).

In some embodiments, semiconductor-switch driver circuits X1, X2, X3, and X4 convert four decoded switching-logic functions into the low-impedance analog PWM switching signals $V_{GS1}$, $V_{GS2}$, $V_{GS3}$, and $V_{GS4}$. The low-impedance analog PWM switching signals $V_{GS1}$, $V_{GS2}$, $V_{GS3}$, and $V_{GS4}$ may include sufficient driving sourcing/sinking current capability in these embodiments. Under the normal operating condition (SD="1"), decoded switching-logic functions for X1, X2, X3, and X4 are PWM, /PWM, /PWM, and PWM, respectively, where "/" signifies logical NOT operation. In this manner, X1 and X2 semiconductor-switch driver circuits can be paired together to control the upper and lower semiconductor switches within one switching-leg of the full-bridge switching network. X3 and X4 driver circuits, however, are paired together to control the upper and lower semiconductor switches within the other switching-leg of the full-bridge switching network.

The upper-switch driver circuits X1 and X3 may possess output floating analog PWM switching signals $V_{GS1}$ and $V_{GS3}$ to drive respective gate-to-source terminals of their associated upper MOSFET semiconductor switches. The upper MOSFET semiconductor switches may include voltages at the source terminals that are not constant (and not tied to ground). In this manner, each of the upper-switch driver circuits X1 and X3 includes a signal level-shifting circuit or an electrical isolation circuit to provide a two-terminal output port across which the floating differential voltage is decoupled or isolated from the system ground reference. The lower-switch driver circuits X2 and X4 and their respective lower MOSFET semiconductor switches share the same ground reference. This way, signal-level shifting or electrical isolation between their input and output signals may not be required.

Figure 13:
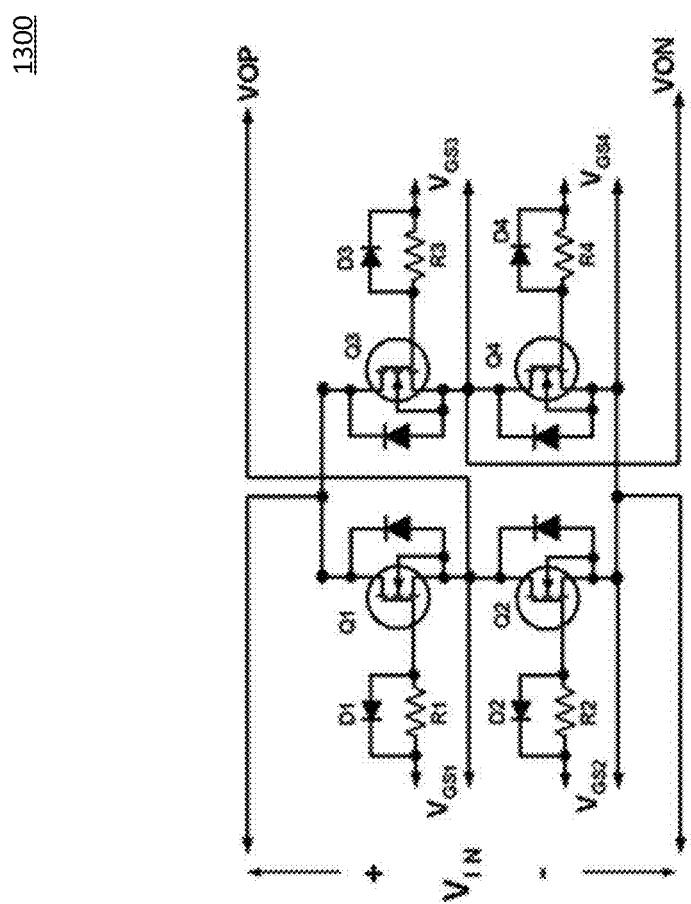
FIG. 13 is a schematic diagram illustrating a full-bridge switching network, according to an embodiment of the present invention.

FIG. 13 is a schematic diagram illustrating a full-bridge switching network 1300, according to an embodiment of the present invention. In this embodiment, the switching network 1300 may include MOSFET switching devices Q1, Q2, Q3, and Q4. Switching network 1300 may process the input voltage $V_{IN}$, which is fed across the drain terminal of the upper switches Q1 and Q3 and the source terminal of the lower switches Q2 and Q4. Switching network 1300 may then deliver a processed output voltage that is a differential-mode voltage across VOP and VON nodes. VOP and VON nodes may be the drain terminals of the lower MOSFET switching devices Q2 and Q4. As shown in FIG. 13, the upper MOSFET switching devices Q1 and Q3 have their source terminals connected to the drain terminals of the respective lower MOSFET switching devices Q2 and Q4. This way, the processed output voltage across the two differential-mode output nodes VOP and VON can be connected to the inverter inductor L and the isolation transformer 120 as shown in FIG. 1.

Each MOSFET switching device Q1, Q2, Q3, or Q4 has a gate terminal and a source terminal connected to respective PWM switching signals $V_{GS1}$, $V_{GS2}$, $V_{GS3}$, or $V_{GS4}$ through respective diode and resistor network (D1 and R1 for Q1, D2 and R2 for Q2, D3 and R3 for Q3, and D4 and R4 for Q4). These diode-and-resistor networks connected at the gates of the MOSFET switches ensure that their turn-on transitions take sufficiently longer time than their turn-off transitions. This way, no overlapping cross-conduction exists between the upper and lower MOSFET switches within each switching leg of switching network 1300 (or 115 shown in FIG. 1).

The built-in body diodes within respective MOSFETs switching devices Q1 to Q4 provide an inherent transient absorption in some embodiments. This is due to re-active current introduced by the load or the utility-grid, since there exists a bulk input filter capacitor $C_{IN}$ terminated across the input of switching network 1300. See, for example, full-bridge switching network 115 of FIG. 1. In this manner, switching network 1300 and bulk capacitor $C_{IN}$ may be provided with an inherent transient-energy absorption due to re-active load characteristics or voltage surges induced externally to the inverter output.

Switching network 1300 in some embodiments may produce the differential-mode output voltage V(VOP)–V(VON). In these embodiments, the waveform may possess a train of switching voltage pulses having a fixed amplitude with its pulse-width being varied in time as a sinusoidal profile. See, for example, FIG. 12. The differential-mode switching pulse voltage V(VOP)–V(VON) may include a positive and negative pulse amplitude of the DC inverter input voltage $V_{IN}$, i.e., V(VOP,VON)=$V_{IN}$ when PWM="1" and V(VOP,VON)=–$V_{IN}$ when PWM="0". During the positive portion of the inverter output voltage Vox, the switching pulse voltage V(VOP, VON) is switched in the +$V_{IN}$ state longer than the –$V_{IN}$ state (duty ratio>50 percent). During the negative portion of Vox, V(VOP, VON) is switched in the +$V_{IN}$ state shorter than the –$V_{IN}$ state (duty ratio<50 percent). When output voltage Vox is crossing 0 V, switching voltages V(VOP, VON) is switched in the +$V_{IN}$ state and the –$V_{IN}$ state like a perfect square-wave (duty ratio=50 percent).

Figure 14:
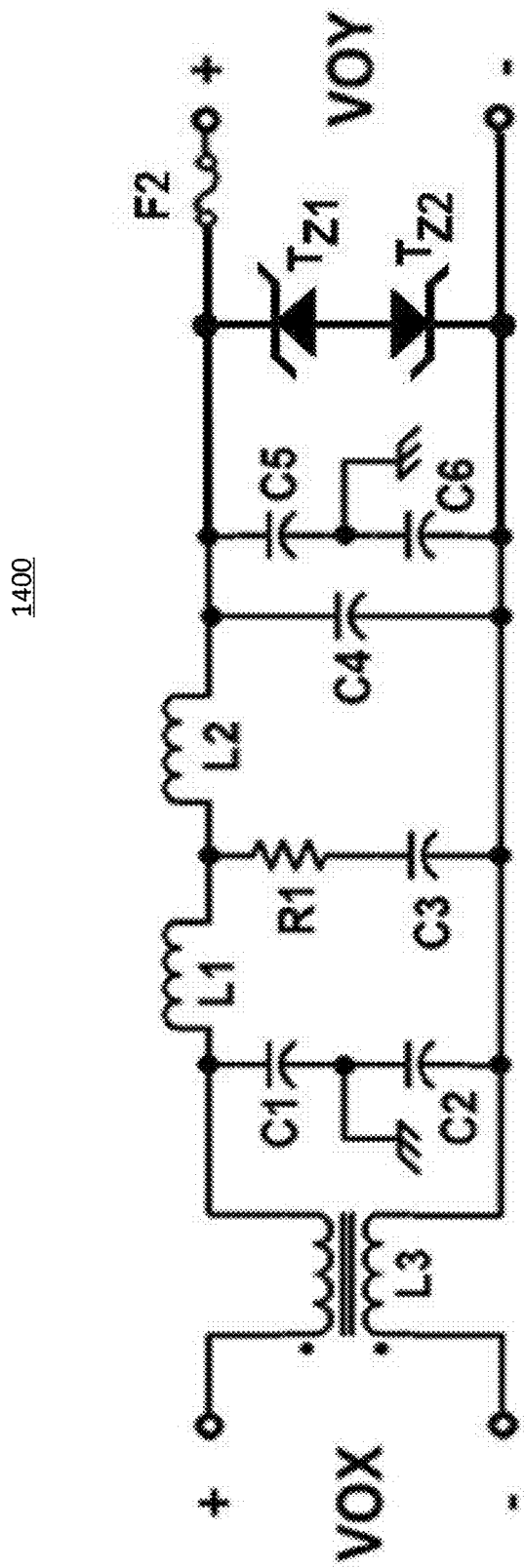
FIG. 14 is a schematic diagram illustrating an output EMI filter, according to an embodiment of the present invention.

FIG. 14 is a schematic diagram illustrating an output EMI filter 1400, according to an embodiment of the present invention. In this embodiment, output EMI filter 1400 may include an input voltage Vox. Input voltage Vox is connected across the secondary winding of the isolation transformer shown in FIG. 1. Output EMI filter 1400 may also include an output voltage Voy. Output voltage Voy is connected to the load circuit shown in FIG. 1 in parallel with a grid-side interfacing network. The grid-side interfacing network may include a grid-interfacing inductor $L_{AC}$ and the utility-grid voltage source connected in series.

Output EMI filter 1400 in this embodiment includes a resistor R1, inductors L1, L2, and L3, and filtering capacitors C1, C2, C3, C4, C5, and C6. Coupled inductor L3 may provide a common-mode impedance path. The common-mode impedance path may have sufficient impedance magnitude at the inverter switching frequency and beyond to attenuate the common-mode switching noise to an acceptable level. Chassis filtering capacitors C1, C2, C5, and C6 may further help bypass the residual common-mode noise current into the inverter chassis structure. This may reduce the common-mode noise current from contaminating the power quality of the utility grid.

A two-stage L-C filter circuit in some embodiments may include inductors L1 and L2, filtering capacitors C3 and C4, and resistors R1. The two-stage L-C filter circuit may provide a differential-mode filtering for the switching noise voltage and current that the inverter circuit tends to generate. The two-stage L-C filter circuit may also provide sufficient AC damping through resistor R1 and filtering capacitor C3. This way, the filtered inverter output voltage and current possess no transient oscillatory ringing, since resistor R1 helps damp out the resonance phenomena that typical L-C circuits may create.

In some embodiments, the differential-mode switching output voltage V(VOP, VON) is low-pass filtered by the cascaded network. The cascaded network may include inductor L (see FIG. 1), transformer 120 (see FIG. 1), and output EMI filter 1400 (or 125 shown in FIG. 1). The cascaded network may deliver the sinusoidal inverter output voltage Voy. See, for example, the bottom plot of FIG. 12.

In other embodiments, to protect the inverter of FIG. 1 from dangerous transient voltage surges, transient voltage absorption devices TZ1 and TZ2 may be connected in series and terminated across the inverter output Voy of output EMI filter 1400. The breakdown voltage across these two series-connected bi-directional transient voltage absorption devices is sufficiently high, and above the maximum peak voltage that the utility grid may occasionally produce. In this manner, induced transient voltage surges, which may be caused by lightning or severe faults within the utility grid, can be limited or significantly attenuated, increasing the overall reliability of the inverter. Fuse F2 shown in FIG. 14 in some embodiments provides an over-current protection as a result of excessive inverter output current.

Returning to FIG. 1 for a moment, electrical isolation between the output of inverter 100 and the remaining control circuits, including SA 105, input EMI filter 110, and the converter input ($V_{IN}$ node and inverter input ground), may be achieved through isolation schemes within the subsystems shown in FIG. 1. For example, electric isolation may be achieved by the isolation transformer or the switching bridge driver circuits through an isolated driving transformer or opto-isolated driving circuit within the PWM switching driver. Electric isolation may also be achieved by the sensed inverter output current $I_O$ and sensed utility grid current $I_{AC}$ via an isolated current sense schemes such as their current-sense transformers or their hall-effect current sensors. Electrical isolation may further be achieved by using the sensed utility grid voltage $V_{AC}$ and sensed inverter output voltage Vox through their isolated voltage sensing schemes such as their voltage-sense transformers.

In some embodiments, system controller reference ground node or chassis ground (see, for example, FIGS. 1-10) may be the input power return terminal of full-bridge switching network 115. This way, all of the sensed and isolated feedback and control signals may be referenced. While SA 105 and input EMI filter 110 may have dedicated transient energy absorption networks installed within input EMI filter 110 for differential-mode voltage transient absorption, the chassis ground may be located at the input power return terminal of inverter 100. The chassis ground may provide the most effective path for absorption of the transient current induced by lightning at the inverter system input.

Furthermore, output EMI filter 125 (or output EMI filter 1400 of FIG. 14) may be protected from harmful common-mode voltage transients induced by lightning coupled into the utility grid by having another transient energy absorption network installed within output EMI filter 125. For example, the transient energy absorption network may be located at the inverter output voltage Voy of output EMI filter 125 with respect to the safety ground return terminal of the utility grid.

In further embodiments, inverter 100 may use the sinusoidal reference signal SINE_AC, which may determine the detailed circuit configuration of the inverter controller. Inverter 100 may process bidirectional power flows that are suitable with loads that are connected in parallel with a utility-grid voltage source, and also stand-alone load configurations without utility-grid.

For a stand-alone load configuration, the load may be resistive, capacitive, or inductive, since the inverter behaves like a voltage source and the interfacing inductor $L_{AC}$ and the utility grid voltage $V_{AC}$ are not needed to connect across the output of inverter 100. Furthermore, reactive component detector and integrator 155 may not be required for the stand-alone load configuration. Rather, in some embodiments, the VPHASE input to the GRID-SYNC phase-controlled SINE-WAVE generator 150 may be tied to ground reference (0 V).

For highly inductive or capacitive load having a Volt-Ampere not exceeding the inverter apparent power rating (rated load V-A product or $V_{RMS}*I_{RMS}$), the full-bridge switching network 115 may control the output voltage of inverter 100 to track the sinusoidal waveform. One reason for this is that the power stage of full-bridge switching network 115 can absorb the reactive energy that the inductive or capacitive load produces, twice in every period of the utility frequency.

For high-performance, single-phase solar inverter systems that allow bi-directional flow and are capable of maintaining output sinusoidal voltage waveforms while driving reactive loads, isolation transformer 120 and full-bridge switching network 115 may be used. The cascaded connection among isolation transformer 120, power stage inductor L, and bi-directional full-bridge switching network 115 provides electrical isolation between the SA 105 and utility grid 135.

Transient protection diodes TZ1 and TZ2 within output EMI filter 125 and input EMI filter 110 provide bi-directional transient energy absorption due to voltage surges and spikes from both utility grid 135 and SA 105. This may include excess energy stored in power stage inductor L and interfacing inductor $L_{AC}$, regardless of the mode of operation of inverter 100, i.e. inverter-input voltage regulation, inverter input power-limit regulation, inverter-output voltage regulation, or inverter shut-down protection, which may provide an inverter shut-down for over/under inverter output voltage, switching network over temperature, over input/output inverter currents.

PWM switching signals $V_{GSi}$ are functions of logical input signals PWM and SD in some embodiments. In embodiments using a sinusoidal reference from which the PWM switching signal is produced by SINE-WAVE regulator controller 185 (see also block 700 shown in FIG. 7), the driving signals are written as four following logical functions:

$$V_{GS1}=V_{GS4}=\text{PWM}\cdot\overline{SD} \qquad \text{Equation (6)}$$

$$V_{GS2}=V_{GS3}=\overline{\text{PWM}}\cdot\overline{SD} \qquad \text{Equation (7)}$$

Where PWM signal has its active duty-ratio $d_{PWM}(t)$ defined as a function of time below, $$d_{PWM}(t)=0.5+k\cdot\sin(\omega t) \qquad \text{Equation (8)}$$

$$k=V(V_{CON})/V_{RAMP} \qquad \text{Equation (9)}$$

$$d_{PWM} \text{ is } T_{ON}(t)/T, k<0.5 \qquad \text{Equation (10)}$$

where $V_{RAMP}$=peak-to-peak voltage of a ramp signal having $0.5V_{RAMP}$ as its peak and $-0.5V_{RAMP}$ as its trough, $T_{ON}(t)$=the time duration in which PWM signal is in the logic "1", T=PWM switching period=$1/F_{SW}$, and $F_{SW}$=switching frequency in Hz.

Including the active power factor correction, the 0-ADC regulation, and the harmonic cancellation, $d_{PWM}(t)$ can be written as $$d_{PWM}(t)=0.5+k\cdot\sin(\omega t+\phi)\cdot\left(1-\frac{V_{INAC}}{V_{IN}}\right)+k_{OFF} \qquad \text{Equation (11)}$$

where $k_{OFF}=V(V_{OFF})/V_R$, which allows the mean value of the active duty-ratio $d_{PWM}$ to be slightly offset from 50 percent to provide a counter-balance compensation for unsymmetrical circuit parameters, k<0.5, which is a function of error control voltage $V_{CON}$, and $\phi$ is a controlled phase shift for active power factor correction delivered by the phase-controlled reference SINE-WAVE generator 150.

Figure 15:
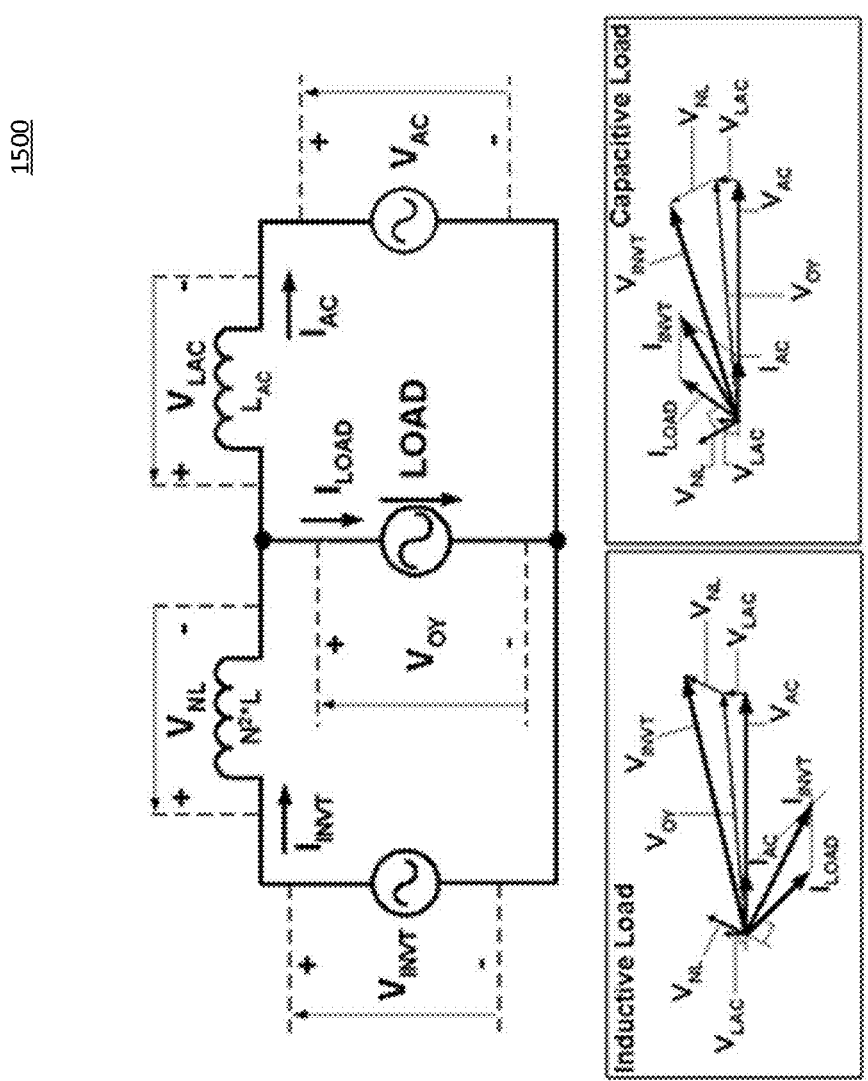
FIGS. 15 and 16 are schematic diagrams illustrating a circuit of an inverter, load, and a utility grid, according to an embodiment of the present invention.
Figure 16:
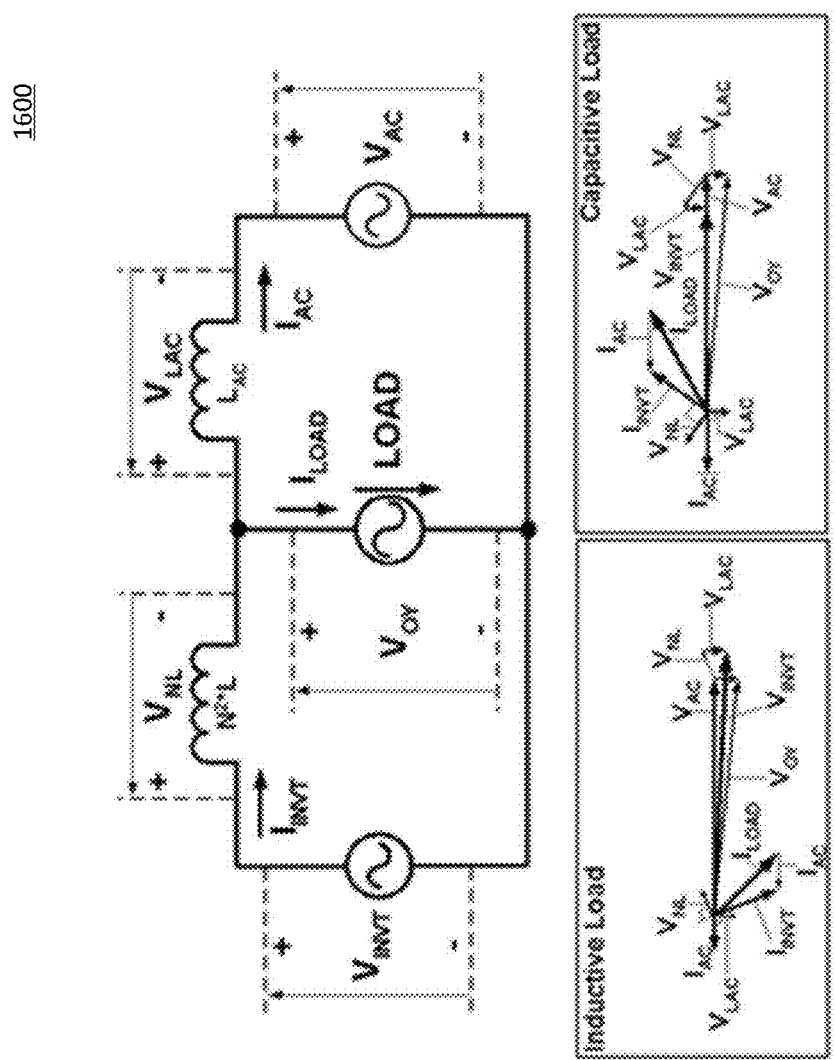

FIGS. 15 and 16 are schematic diagrams illustrating circuits 1500, 1600 of an inverter, load, and a utility grid, according to an embodiment of the present invention. In certain embodiments, the voltage-mode inverter using an AC sinusoidal reference may be represented by circuits 1500 or 1600. The inverter in some embodiments is realized as an AC voltage source (or inverter output voltage) $V_{INVT}$ connecting in series with its output inductance $N^2*L$. N may be the output transformer secondary-to-primary turn ratio (Ns/Np). The grid interfacing circuit across the inverter output may be a series connection of an ideal utility grid voltage $V_{AC}$ and the interfacing inductor $L_{AC}$.

In parallel with the grid interfacing circuit and the inverter output, a "LOAD" may be represented by an AC current sink that absorbs energy from the surrounding circuit. The inverter may deliver an AC sourcing output current $I_{INVT}$ to fulfill the given load current demand $I_{LOAD}$, and provide excess power to be absorbed by the utility grid through utility grid current $I_{AC}$. In some embodiments, inverter current source $I_{INVT}=I_{LOAD}+I_{AC}$.

For parameters, utility grid voltage $V_{AC}$, load current $I_{LOAD}$ with amplitude and phase with respect to the utility grid voltage $V_{AC}$, and inverter limited sourcing power $P_{LIM}$, the inverter may regulate the full-bridge switching network by producing the inverter output voltage $V_{INVT}$ with proper amplitude and phase with respect to utility-grid voltage $V_{AC}$. This way, the utility grid current $I_{AC}$ has zero reactive component with respect to utility-grid voltage $V_{AC}$.

In the embodiments shown herein, the following AC voltages are the supporting circuit responses that mathematically agree with the delivered inverter output voltage $V_{INVT}$, load current $I_{LOAD}$, and utility grid voltage $V_{AC}$: 1) the inductive voltage drop within the inverter circuit $V_{NL}$, 2) the inductive voltage drop within the utility-grid interface circuit $V_{LAC}$, and 3) the LOAD voltage $V_{OY}$. For utility grid voltage $V_{AC}$, given load current $V_{LOAD}$, and inverter limited sourcing power $P_{LIM}$, the three AC response voltages, which are the inverter's internal inductive voltage $V_{NL}$, the total utility's inductive voltage $V_{LAC}$, and the LOAD voltage $V_{OY}$, can be solved using a phasor diagram. When, for example, the inverter has an excess amount of power above the load demand, the utility grid current $I_{AC}$ absorbed by the utility grid voltage $V_{AC}$ can be controlled to be in-phase with utility grid voltage $V_{AC}$ shown in FIG. 15 by delivering the inverter output voltage $V_{INVT}$. The inverter output voltage $V_{INVT}$ may possess sufficient phase lead with respect to the utility grid voltage $V_{AC}$. Regardless of the resistive, inductive, or capacitive load condition, FIG. 15 shows a phasor diagram 1500 for all 5 voltages and 3 currents from which the inverter output voltage $V_{INVT}$ and the load voltage $V_{OY}$ provide phase leading with respect to the utility grid voltage source $V_{AC}$.

When the inverter provides insufficient power below the load demand and extra power from the utility grid is delivered to fulfill the load demand, the utility grid voltage $V_{AC}$ delivers the utility grid current $I_{AC}$ controlled to be out-of-phase with utility grid voltage $V_{AC}$ (see FIG. 16) by delivering the inverter output voltage $V_{INVT}$ that possesses sufficient phase lag with respect to the utility grid voltage $V_{AC}$. Regardless of the resistive, inductive, or capacitive load condition, FIG. 16 shows a phasor diagram 1600 for all 5 voltages and 3 currents from which the inverter output voltage $V_{INVT}$ and the load voltage $V_{OY}$ provide phase lagging with respect to the utility grid voltage $V_{AC}$.

Figure 17:
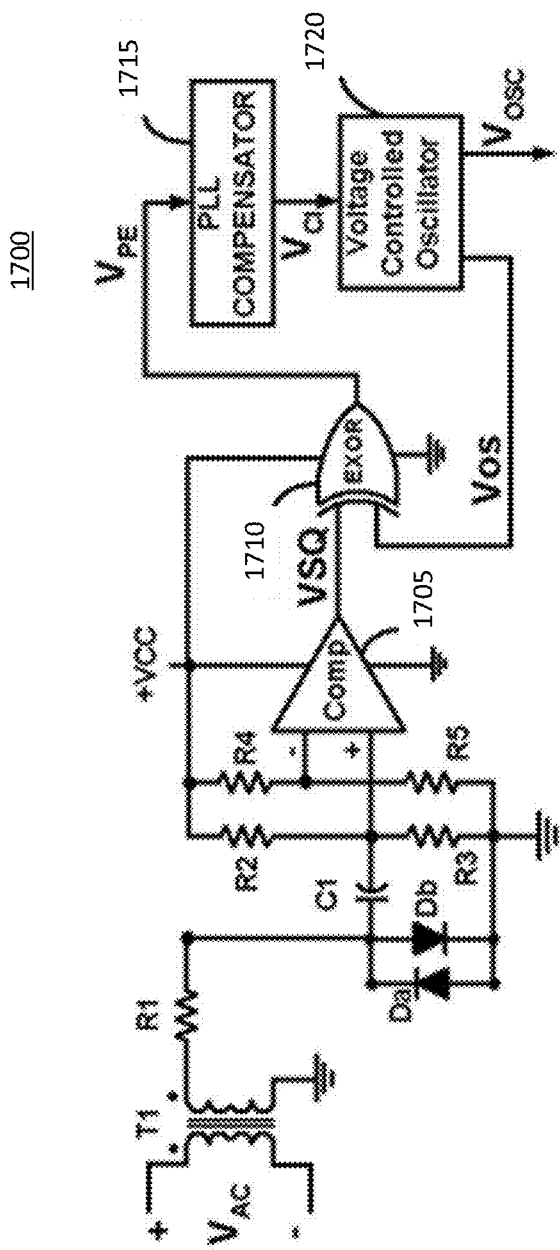
FIG. 17 is a schematic diagram illustrating a phase locked loop (PLL) controller, according to an embodiment of the present invention.

FIG. 17 is a schematic diagram illustrating a phase locked loop (PLL) controller 1700, according to an embodiment of the present invention. PLL controller 1700 may accept utility grid voltage $V_{AC}$ as the input, and produce a continuous sinusoidal voltage signal $V_{OSC}$ in-phase with the utility grid voltage $V_{AC}$. PLL controller 1700 may include the voltage-sensed isolation transformer T1, a zero-voltage crossing (ZVC) detector circuit 1705, phase-comparator using an exclusive-OR (EX-OR) logic 1710, the PLL compensator 1715, and the voltage controlled oscillator 1720.

In some embodiments, ZVC detector 1705 may include a voltage comparator, resistors R1 to R5, voltage clamping diodes Da and Db, and AC-coupling capacitor C1 to remove the DC component out of the grid voltage sensed signal. PLL controller 1700 may maintain the sinusoidal waveform of the continuous sinusoidal voltage signal $V_{OSC}$ despite a temporary loss of the utility grid voltage $V_{AC}$ or a grid-voltage's distortion from its sinusoidal wave-shape. This can be achieved, since voltage-controlled oscillator (VCO) 1720 delivers free-running signals $V_{OS}$ and continuous sinusoidal voltage signal $V_{OSC}$ that have the idle frequency of nearly the same as the grid frequency.

The zero-voltage crossing detector output VSQ may produce a square-wave voltage signal, which may be in-phase with the utility grid voltage $V_{AC}$. VCO 1720 may also produce a square-wave voltage signal $V_{OS}$ with some phase shift with respect to the zero-voltage crossing detector output VSQ. Exclusive-OR logic gate 1710 produces phase-error voltage signal $V_{PE}$. PLL compensator 1715 may provide low-pass filtering to remove most of the AC components from the phase error voltage signal $V_{PE}$, and may deliver the filtered control signal $V_{CI}$ to VCO 1720.

In some embodiments, oscillator output voltage $V_{OS}$ may include a 90-degree phase shift with respect to the zero-voltage crossing detector output VSQ, and the phase-error voltage signal $V_{PE}$ may include a DC value of 50 percent of the DC power supply voltage +VCC. The DC power supply voltage +VCC may be used to bias the EX-OR phase-comparator 1710. However, during transient conditions, the phase-shift between $V_{OS}$ and VSQ signals may deviate from 90 degrees so that the two controlled-oscillator output voltage signals $V_{OS}$ and $V_{OSC}$ are controlled to have the same frequency as the grid-voltage's frequency.

Figure 18:
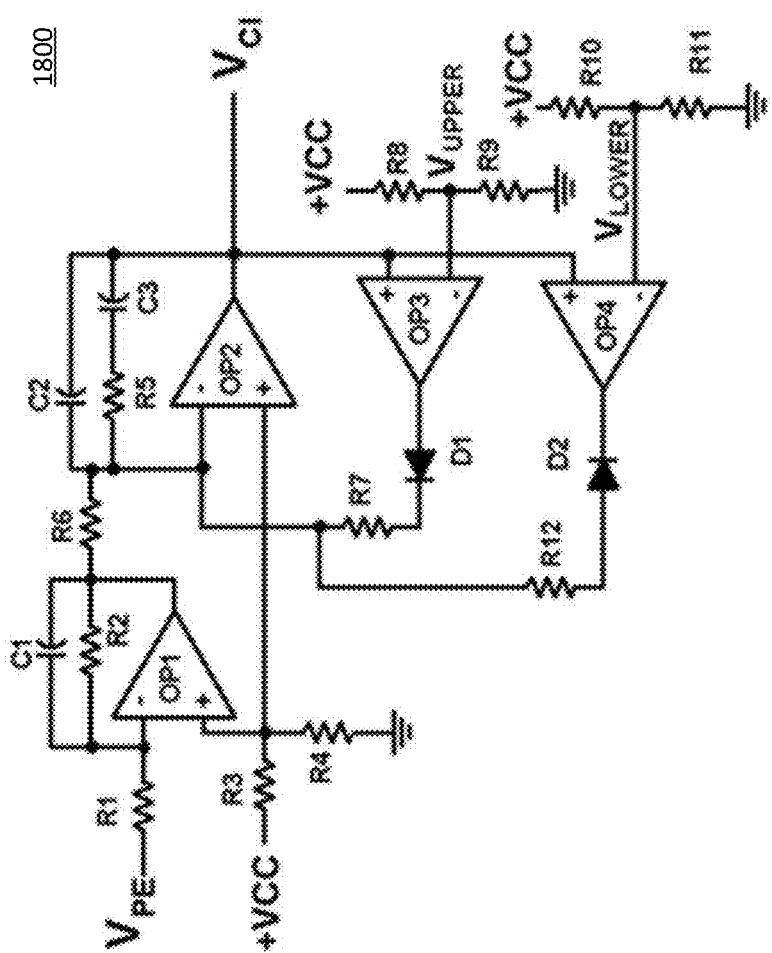
FIG. 18 is a schematic diagram illustrating a PLL compensator within PLL controller of FIG. 17, according to an embodiment of the present invention.

FIG. 18 is a schematic diagram illustrating a PLL compensator 1800 within the PLL controller 1700 of FIG. 17 (or specifically block 1715), according to an embodiment of the present invention. In certain embodiments, the PLL compensator is a passive R-C LPF that retains the DC component of the phase-error voltage signal $V_{PE}$, and removes most of the AC high-frequency components. However, the R-C LPF compensator may still produce marginal stability response. This may cause a slowly damped-out oscillatory phase ringing during a transient disturbance on the utility grid voltage $V_{AC}$ or during a system start-up. This oscillatory transient response may cause an inverter start-up from its first turn-on state towards its steady state operation to be erratic. This is primary due to the inverter output current reaching an over current protection (OCP) threshold to cause the OCP shut-down to be prolonged such that this shut-down/re-start process is endlessly sustained without being able to reach the steady state inverter operation.

To remove this marginal stability performance in the PLL control loop, a PLL compensator 1800 in certain embodiments may use an active filtering circuit instead of the conventional R-C LPF circuit. See, for example, PLL compensator 1800 of FIG. 18. PLL compensator 1800 may include cascaded stages of filtering, LPF with OP-AMP OP1, and an integral lead-lag compensation circuit with OP-AMP OP2.

In some embodiments, OP-AMP stages of PLL compensator 1800 includes OP-AMPs OP1 and OP2, resistors R1-R6, and capacitors C1-C3. In those embodiments, the controlled-oscillator voltage output $V_{OSC}$ may reach a steady state without a transient phase oscillation as a result of robust stability margin. The robust stability margin may be achieved from PLL compensator 1800 such as over 60 degrees of phase margin.

This way, the input phase error voltage signal $V_{PE}$ is processed by PLL compensator 1800, resulting in a filtered voltage control signal $V_{CI}$ as an analog control output. Furthermore, the range of the analog control voltage feeding the filtered voltage control signal $V_{CI}$ can be restricted to be within a narrower voltage band to prevent any abrupt large phase change during a system start-up or prevent a grid-voltage disturbance from occurring. This ensures oscillation-free transience and smooth phase-lock operation in the PLL control loop.

The voltage-range restriction for the filtered voltage control signal $V_{CI}$ is achieved by the active clamping circuit in some embodiments. The active clamping circuit may include two OP-AMPs OP3 and OP4 to limit the filtered voltage control signal $V_{CI}$ from exceeding an upper voltage limit $V_{UPPER}$ and from dropping below lower voltage limit $V_{LOWER}$. In some embodiments, the upper voltage limit $V_{UPPER}$ plus the lower voltage limit $V_{LOWER}$ may equal to DC power supply voltage VCC. In certain embodiments, a free-running VCO operates with filtered voltage control signal $V_{CI}$=VCC/2 under an absence of the utility grid voltage $V_{AC}$. The active voltage restriction circuit may include OP-AMPs OP3 and OP4, resistors R7-R12, and diodes D1 and D2 in certain embodiments.

Figure 19:
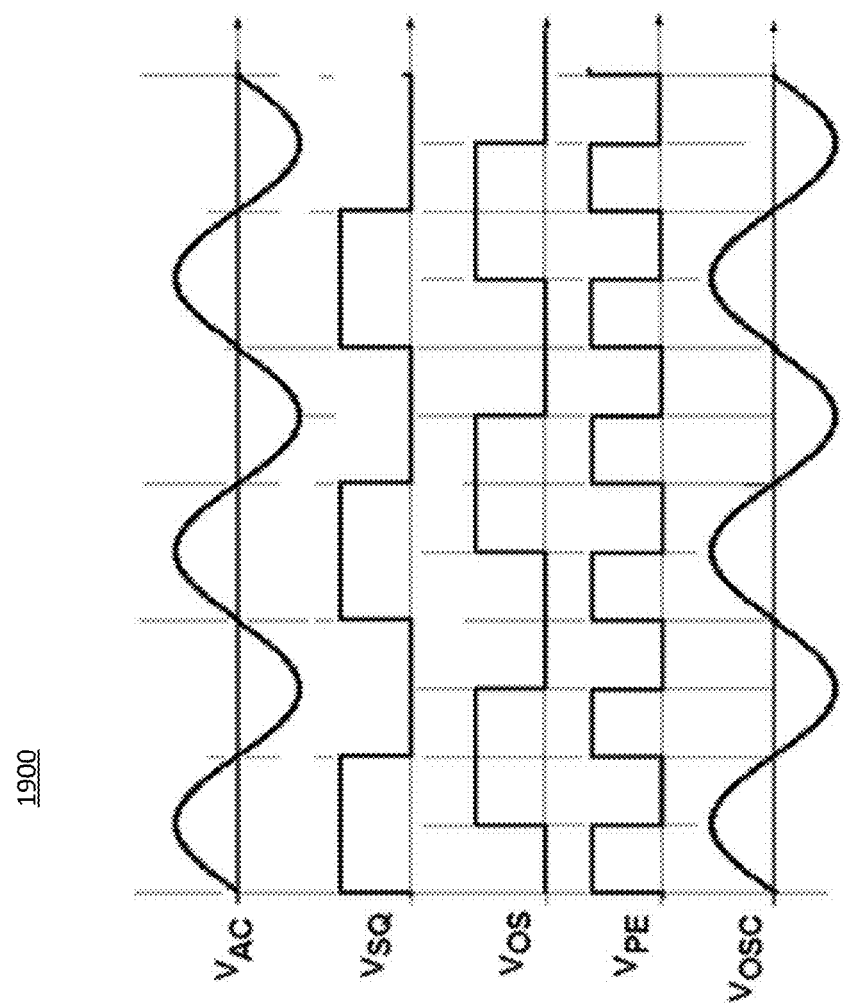
FIG. 19 is a timing diagram illustrating signals associated with the PLL controller, according to an embodiment of the present invention.

FIG. 19 is a timing diagram illustrating signals 1900 associated with the PLL controller 1800 of FIG. 18, according to an embodiment of the present invention. In this embodiment, waveforms of utility grid voltage $V_{AC}$, grid-derived square-wave signal VSQ, square-wave oscillator signal VOS, phase error signal $V_{PE}$, and sinusoidal oscillator signal $V_{OSC}$ are shown. The square-wave signal VSQ may be in-phase with the utility grid voltage $V_{AC}$, whereas the square-wave oscillator signal VOS may include approximately 90 degrees phase lag with respect to the utility grid voltage $V_{AC}$. Since the VCO may be designed to have free-running frequency at the typical utility grid frequency, the 90-degree phase lag of the square-wave oscillator signal VOS may cause the phase error voltage signal $V_{PE}$ to be a square-wave. The square wave may be twice the grid frequency with an operating DC voltage of VCC/2.

The sinusoidal oscillator signal $V_{OSC}$ and the square-wave oscillator signal VOS may have the same frequency, and may retain a 90-degree phase difference since they are produced by the same VCO. Consequently, the sinusoidal oscillator signal $V_{OSC}$ may be controlled to have the same frequency as that of the utility grid and typically in-phase with utility grid voltage $V_{AC}$. It may be possible that the frequency of utility grid voltage $V_{AC}$ or the free-running frequency of sinusoidal oscillator signal $V_{OSC}$ may deviate from the typical grid-frequency. When, for example, this deviation from typical grid frequency occurs, the square-wave oscillator signal VOS may have a phase response deviated from the typical 90-degree phase lag, i.e., produces slightly below a 90-degree phase lag to lower the VCO frequency when the grid frequency drops below its typical frequency. In another example, when the deviation from typical grid frequency occurs, the square-wave oscillator signal VOS may have a phase response that produces slightly above a 90-degree phase lag to increase the VCO frequency when the grid frequency drifts above its typical frequency. In certain embodiments, sinusoidal oscillator signal $V_{OSC}$ may be controlled in synchronization with the utility grid voltage $V_{AC}$, and may exhibit, with respect to the utility grid voltage $V_{AC}$, a slightly small phase-lead when the grid frequency is slightly below its typical value, a slightly small phase-lag when the grid frequency is slightly above its typical value, or a perfectly in-phase when the grid frequency is at its typical value.

Figure 20:
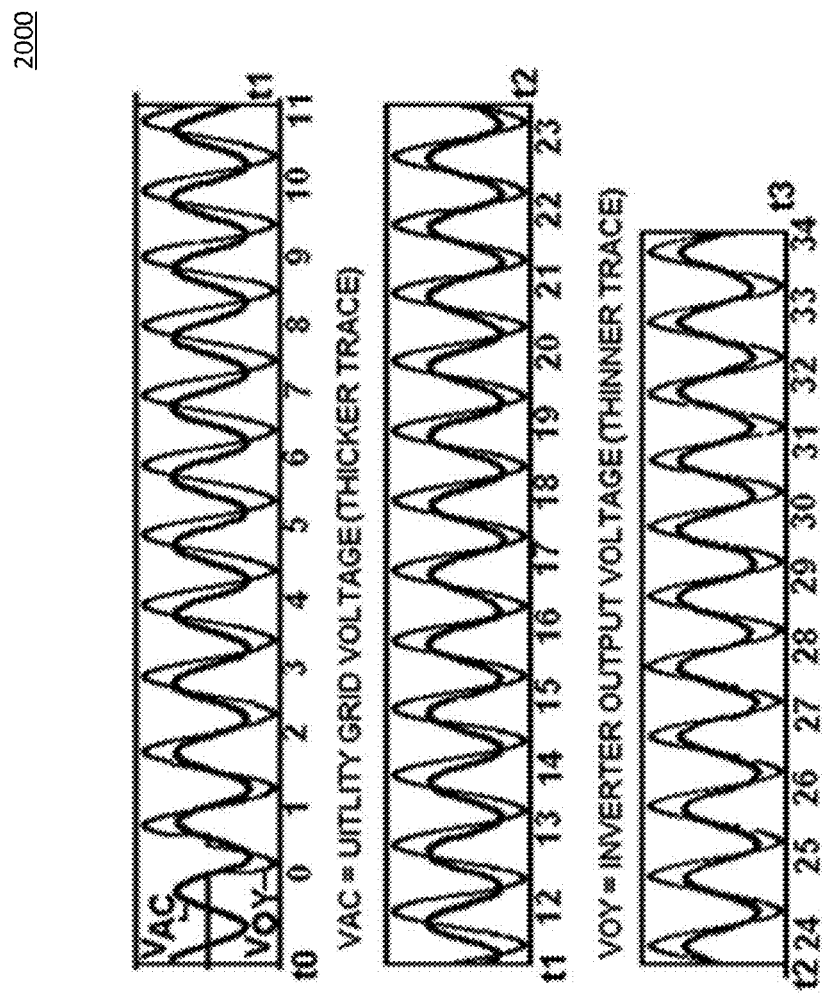
FIG. 20 is a computer simulation illustrating a transient start-up of a PLL inverter, according to an embodiment of the present invention.

FIG. 20 is a computer simulation 2000 illustrating a transient start-up of a PLL inverter, according to an embodiment of the present invention. In some embodiments, computer simulation 2000 shows a PLL prototype's response of the voltage-mode inverter output voltage $V_{OY}$ with respect to the utility grid voltage $V_{AC}$. In computer simulation 2000, from a start-up instant after time to, the voltage-mode inverter output voltage $V_{OY}$ may be built up from zero voltage with a significant phase lag with respect to the utility grid voltage $V_{AC}$. This can be inspected from the top plot for the first time interval $t_0<t<t_1$ during which the inverter has started an operation for 11 cycles of utility grid frequency.

As time passes, the PLL closed-loop control gradually reduces the phase lag to a smaller value in the second time interval $t_1<t<t_2$ during which the inverter has experienced 12 cycles of the utility grid voltage $V_{AC}$. See, for example, cycles 12 to 13 of FIG. 20. In the third time interval $t_2<t<t_3$ during which the inverter has experienced the grid voltage, the voltage-mode inverter output voltage $V_{OY}$ and utility grid voltage $V_{AC}$ are practically in-phase and stay in a perfect synchronization without a phase oscillation. See, for example, cycles 24 to 34 of FIG. 20. From the prototype testing result, it should take approximately 25 to 30 cycles of utility grid frequency to lock the inverter output frequency to the grid frequency.

Figure 21:
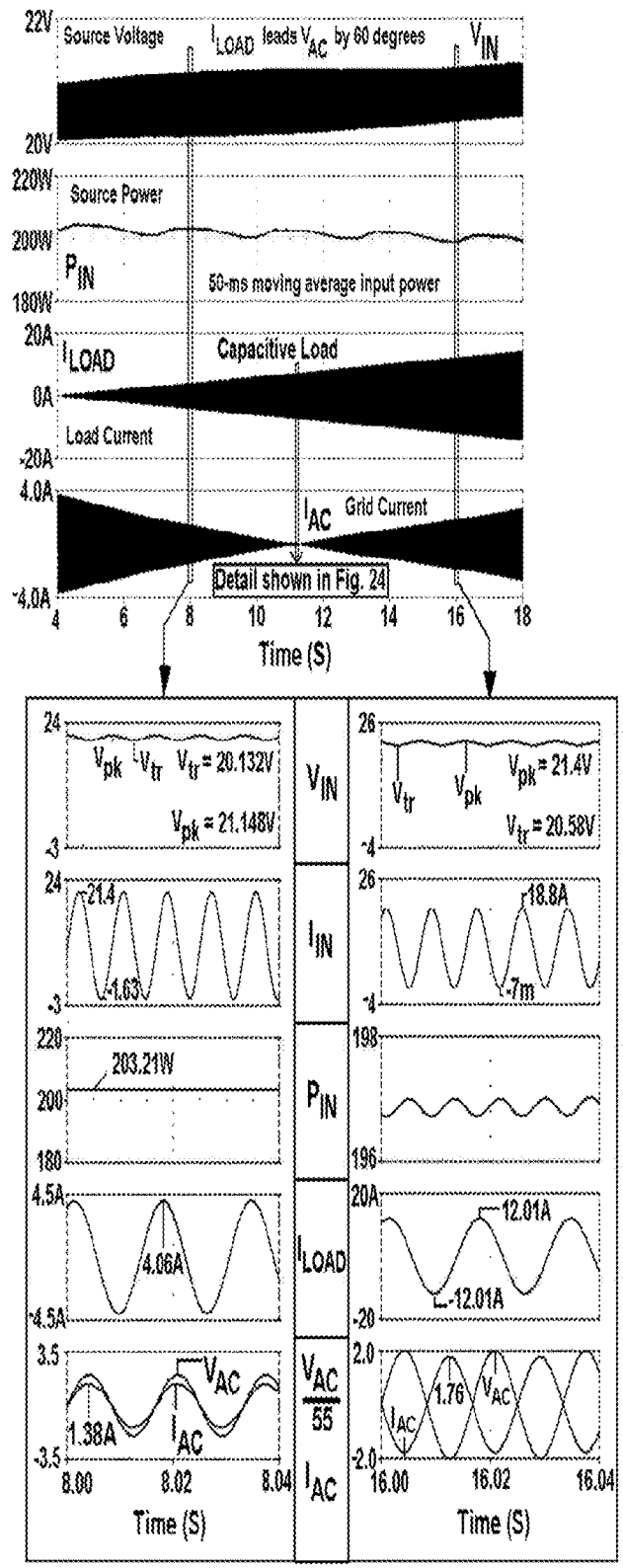
FIGS. 21 and 22 are graphs illustrating inverter responses, according to an embodiment of the present invention.
Figure 22:
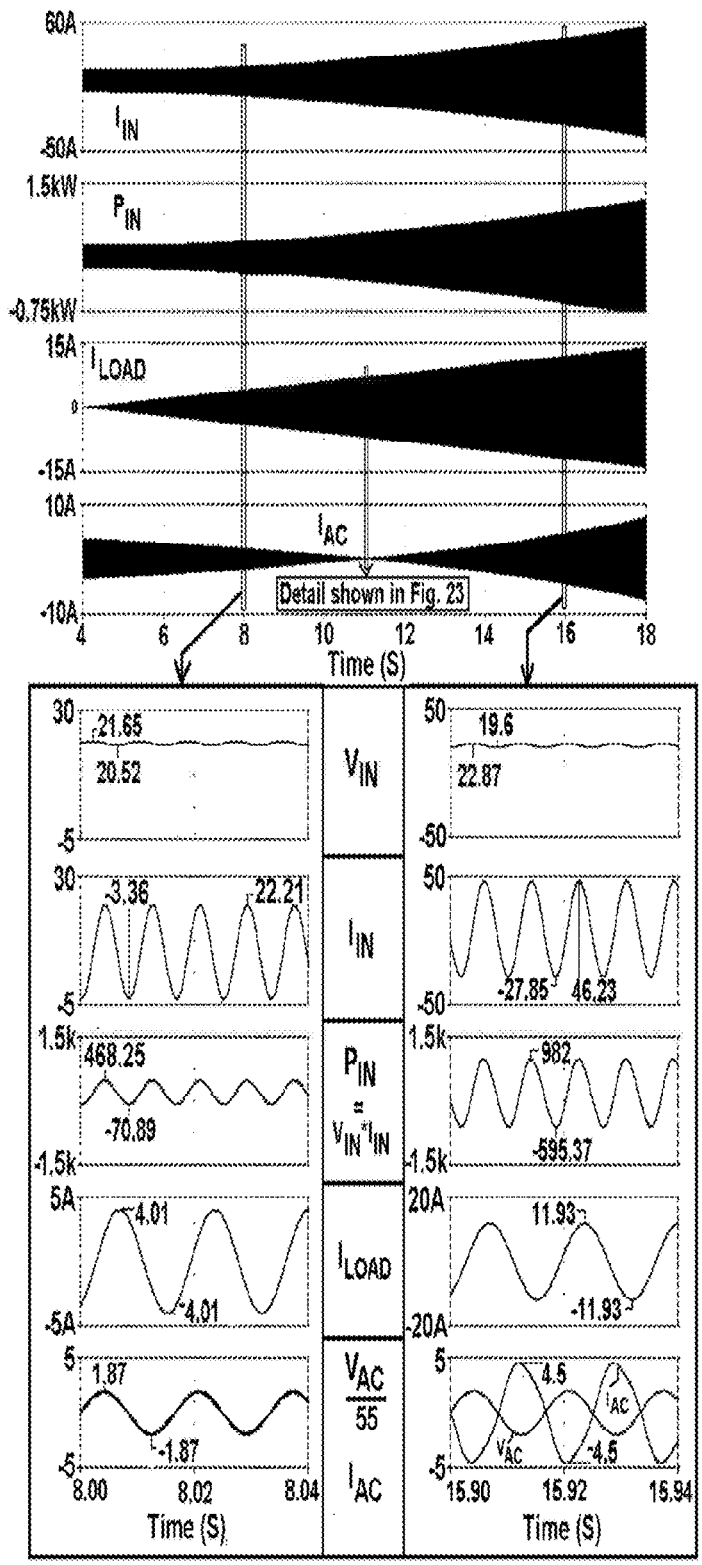

FIGS. 21 and 22 are graphs 2100 and 2200 illustrating inverter responses, according to an embodiment of the present invention. In certain embodiments, graphs 2100 and 2200 show a computer simulation of the closed-loop voltage-mode inverter for both capacitive and inductive load conditions. Under these load conditions, the amplitude of the AC load current was scanned from 10 mA to 14 A, when the inverter output sourcing power is controlled by the inverter input voltage regulation. The inverter input voltage regulation may limit in some embodiments the inverter output power to around 200 W. When the load current $I_{LOAD}$ is zero or small, e.g., at 10 mA, nearly all of the inverter output sourcing power is transferred to the utility grid and the amplitude of utility grid current $I_{AC}$ is around 3.6 A at time=4 S. See, for example, the bottom plots of FIGS. 21 and 22. As load current $I_{LOAD}$ increases, utility grid current $I_{AC}$ is decreased as more inverter power is transferred to the load and less inverter power is applied to the grid. This may occur, for example, while the inverter's input (or transferred) power $P_{IN}$ of 200 W is sustained.

In one example, a capacitive load in the detailed simulation waveforms displayed on the lower left side of FIG. 21 for time t=8 to 8.04 S, the following responses are revealed: the inverter input voltage $V_{IN}$, the inverter input current $I_{IN}$, the 50-mS moving-average of the inverter input power $P_{IN}$, the load current $I_{LOAD}$, and the utility grid current $I_{AC}$ being paired with the utility grid voltage $V_{AC}$, uncovering the in-phase responses between utility grid current $I_{AC}$ and utility grid voltage $V_{AC}$ and showing that the excess inverter power above the load demand is absorbed by the utility grid.

Similarly, an inductive load in the detailed simulation waveforms displayed on the lower left side of FIG. 22 for time t=8 to 8.04 S, the following six responses are revealed: input voltage $V_{IN}$, input current $I_{IN}$, instantaneous input power $P_{IN}$, load current $I_{LOAD}$, and utility grid voltage $I_{AC}$ being paired with utility grid voltage $V_{AC}$, exhibiting the in-phase responses between utility grid current $I_{AC}$ and utility grid voltage $V_{AC}$. This may also show that the excess inverter power above the load demand is absorbed by the utility grid.

In other embodiments, when the load demand exceeds the controlled inverter power limit (e.g., around 200 W), the utility grid provides supplementary power to fulfill the excess load demand above 200 W inverter power limit. See, for example, the detailed simulation waveforms displayed on the lower right side of FIG. 21 for time t=16 to 16.04 S under a capacitive load. See also FIG. 22 for time t=15.9 to 15.94 S under an inductive load.

Under both capacitive and inductive load conditions that consume power above the inverter 200-W power limit, the utility grid current $I_{AC}$ and utility grid voltage $V_{AC}$ are out-of-phase from each other. Input voltage $V_{IN}$, input current $I_{IN}$, and input power $P_{IN}$ have their DC operating values being superimposed by their respective AC sinusoidal ripple at twice the grid frequency, where their DC operating values are computed to be 50% of the sum between their peak and trough values.

Figure 23:
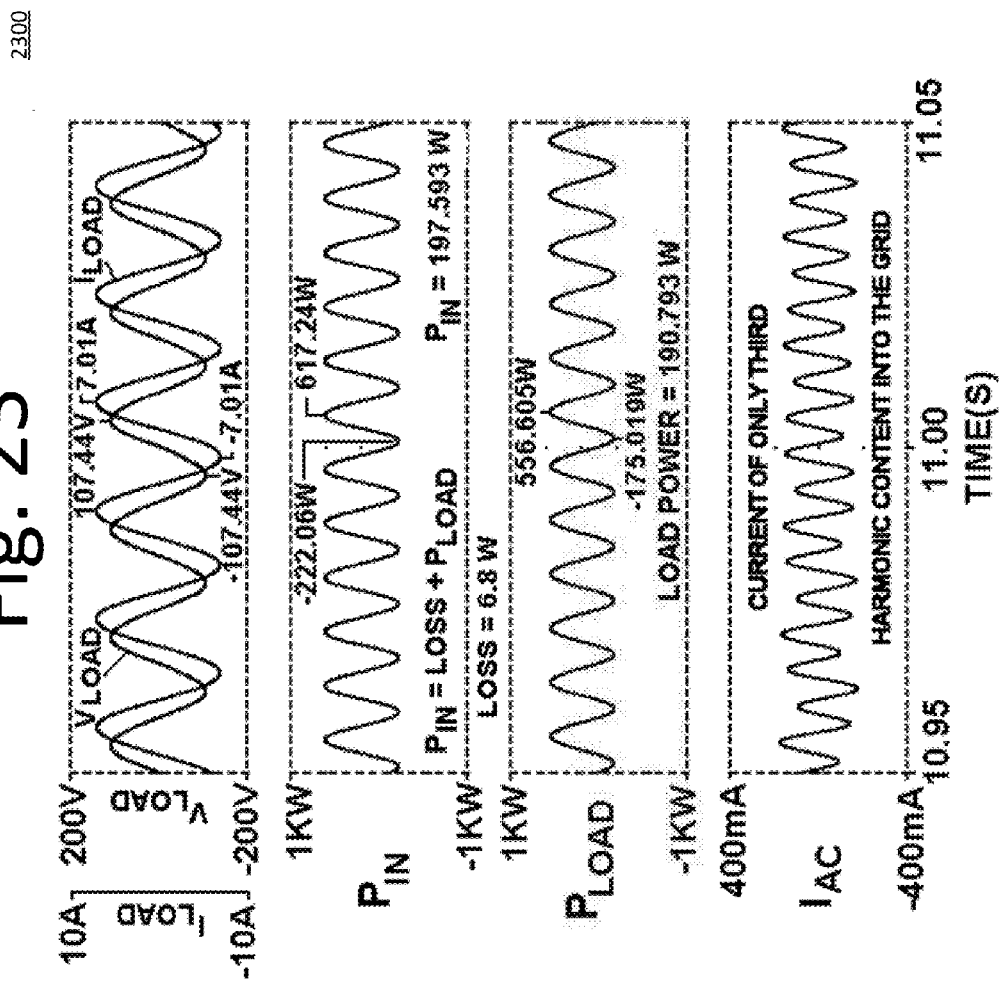
FIGS. 23 and 24 are graphs illustrating detailed responses, according to an embodiment of the present invention.
Figure 24:
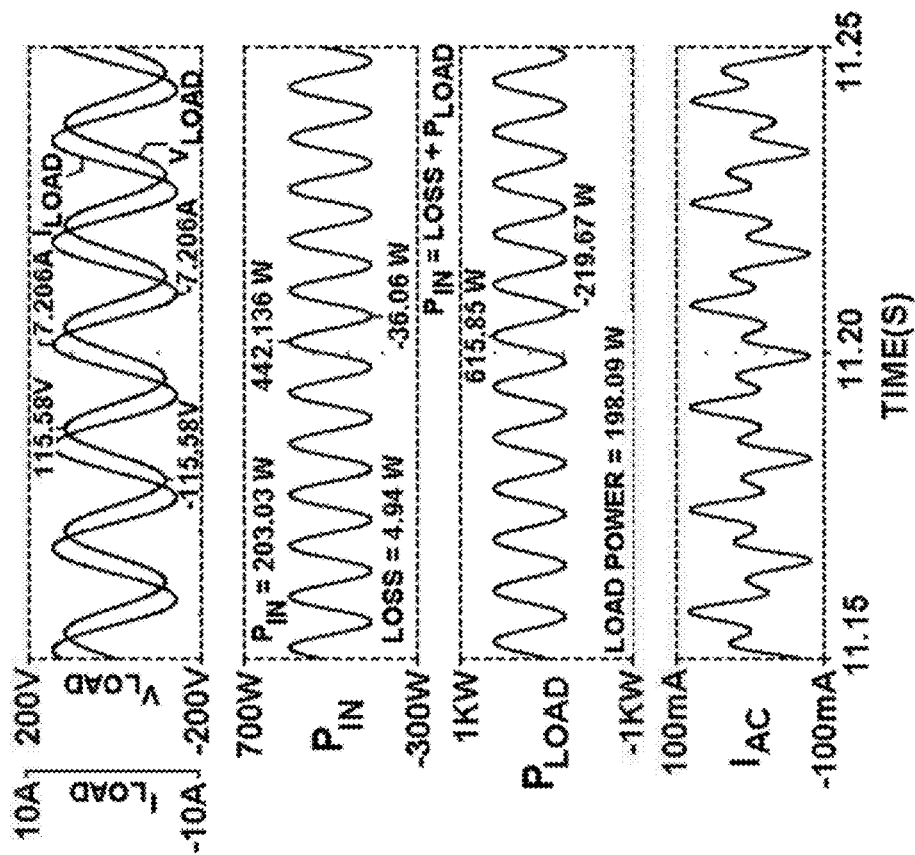

FIGS. 23 and 24 are graphs 2300 and 2400 illustrating detailed responses, according to an embodiment of the present invention. Graph 2300 of FIG. 23 shows detailed waveforms of load voltage $V_{LOAD}$, load current $I_{LOAD}$, input power $P_{IN}$, input load $P_{LOAD}$, and utility grid current $I_{AC}$. These may all be extracted from the same simulation results at time t=11 S (see FIG. 22) for an inductive load, i.e. where load current $I_{LOAD}$ exhibits a phase-delay with respect to the utility grid voltage $V_{AC}$. For 10.95 S<t<11.05 S, when the inductive load $P_{LOAD}$ consumes the same power as the input power $P_{IN}$ or $P_{LOAD} \rightarrow P_{IN}$, the utility grid current $I_{AC} \rightarrow 0$ at the utility frequency (see the utility grid current $I_{AC}$ plot in FIG. 22 at t=11 S). Due to distributed imperfections in the inverter power stage and control, there may be some small grid current that exhibits the third harmonic frequency with respect to the grid frequency, i.e., without the harmonic cancellation 500 of FIG. 5.

Graph 2400 of FIG. 24 shows the detailed waveforms of voltage load $V_{LOAD}$, current load $I_{LOAD}$, input power $P_{IN}$, input load power $P_{LOAD}$, and utility grid voltage $I_{AC}$. These may all be extracted from the same simulation results at time=11 S (see FIG. 21) for a capacitive load. For 11.15 S<t<11.25 S, the capacitive load may consume nearly the same power, which may be delivered by the inverter output.

This may cause the grid current at the utility frequency to reduce to nearly zero. Due to similar imperfections distributed in the inverter power stage and control, some small grid current having the third harmonic frequency with respect to the grid frequency still exists, i.e., the harmonic cancellation 500 of FIG. 5 was not included.

Figure 25:
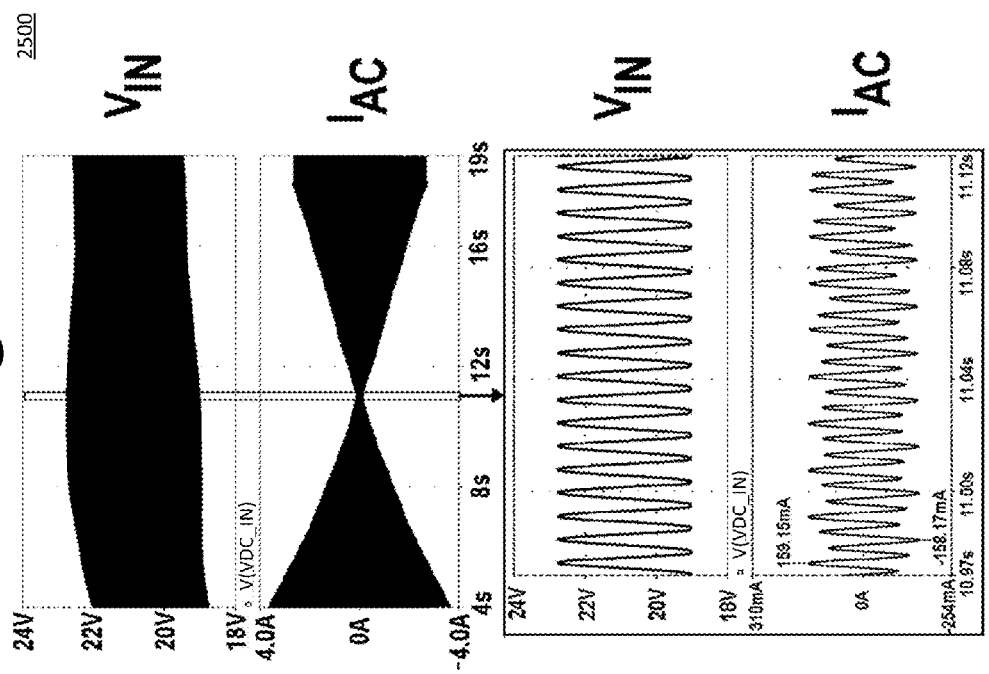
FIG. 25 is a graph illustrating inverter responses excluding harmonic cancellation control, according to an embodiment of the present invention.
Figure 26:
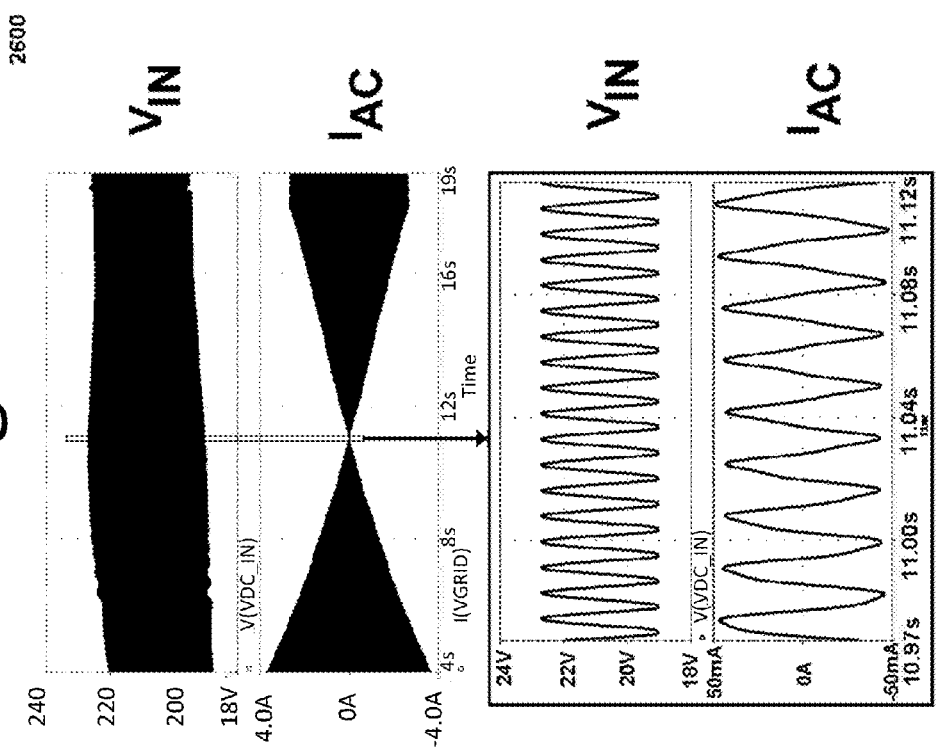
FIG. 26 is a graph illustrating inverter responses including harmonic cancellation control, according to an embodiment of the present invention.

FIG. 25 is a graph 2500 illustrating inverter responses without harmonic cancellation, according to an embodiment of the present invention. FIG. 26 is a graph 2600 illustrating inverter responses with harmonic cancellation, according to another embodiment of the present invention. In graphs 2500 and 2600, the effectiveness of harmonic cancellation 500 of FIG. 5 was verified by comparable simulation results obtained from the inverter system before (see graph 2500) and after (see graph 2600) the inclusion of the harmonic cancellation method. FIG. 25, for example, reveals that the inverter's responses before the inclusion of the harmonic cancellation circuit. Without the harmonic cancellation 500 FIG. 5, the peak-to-peak grid current is 317.3 mA, which dominantly under the influence of the third harmonic frequency, i.e., 180 Hz, as shown on the bottom plot 2500 in FIG. 25. On the contrary, with the harmonic cancellation, the third harmonic content is almost entirely eliminated, leaving only the less than 100-mA peak-to-peak current, which dominantly occurs at the fundamental frequency, i.e., 60 Hz, which is depicted as the detailed waveform of AC current $I_{AC}$ on the bottom plot 2600 in FIG. 26.

In some embodiments, grid-sync phase-controlled reference sine-wave generator may be configured with simple analog and digital discrete parts. See, for example, FIGS. 4 and 5. Application-specific integrated circuits (ASICs) can be developed in some embodiments using similar analog and discreet configurations as discussed herein. Furthermore, when the SA characteristics are weak due to long-term degradation and/or low solar flux, the inherent dither signals extracted from the SA voltage and power signals may be too small to accurately determine a proper control direction toward the maximum power point. Under these circumstances, an additional dither signal may be injected and superimposed on the commanding set-point voltage $V_{SP}$ to allow the extracted dither signals to achieve a better signal-to-noise ratio for better tracking efficiency. The extra dither signal of a lower frequency with respect to the frequency of the inherent dither signal (100/120 Hz) may be preferred in some embodiments, such as at 10 to 15 Hz, since the input voltage regulation control loop may include the comparable unity-gain crossover frequency. This may allow the SA voltage and current to produce sufficient AC amplitude of the extracted dither signals used for maximum power tracking.

In some embodiments, a power and control system may include a voltage-mode inverter interfaced between a DC power source and an AC utility grid. Utilizing an inverter power stage of a full-bridge switching configuration, a single stage of DC-to-AC power conversion may be controlled to achieve maximum power tracking from the DC power source, and a driving sinusoidal output voltage with a proper phase-shift with respect to the utility grid voltage. This may prevent the utility grid current from containing reactive component at the utility grid frequency regardless of the inverter's load type (resistive, capacitive, or inductive).

In certain embodiments, the power and control system may include harmonic-cancellation to eliminate most or all of the harmonic content in the inverter output voltage, and provide a proper phase-shift control that results in an in-phase (absorbing power) or out-of-phase (providing power) utility-grid current (with zero-reactive component or unity power factor correction) with respect to the utility grid voltage. This may be achieved while absorbing either maximum power available from the DC power source or limiting the delivered AC output power without exceeding the inverter rated power or the maximum rated output voltage.

In other embodiments, the power and control system may include an automatic closed-loop control to eliminate a DC current from being inadvertently present in the inverter output current, preventing magnetic saturation from occurring to isolation transformers sharing the utility grid voltage.

In some embodiments, regardless of the state of the input power source, the inverter power and control system may provide active power factor correction at all times. In these embodiments, a set of inverter loads are included as part of the inverter power and control system sharing the same utility-grid transmission cable.

Furthermore, the inverter power and control system may in some embodiments be applicable to manage the power transfer from the power source to the utility grid. The inverter power and control system may also charge the input power source to effectively serve as a battery charger from the utility grid due to the bi-directional power processing capability.

Because the exact regulation of the sinusoidal waveform is not needed in some embodiments, the control loop may be easily designed and stabilized. As a result, the control loop may be free from the undesirable interactions existing between the back-end EMI filter's resonance and the high-bandwidth control loop conventionally designed for the exact regulation of the sinusoidal waveform.

In further embodiments, a harmonic cancellation method may remove the harmonic content from being present to the inverter output voltage, leaving the inverter voltage with the anticipated sinusoidal waveform at the utility-grid frequency.

In certain embodiments, 0-ADC regulation control may ensure that the inverter output current includes zero DC component during the transient state and steady-state. This way, magnetic saturation is prevented from occurring to isolation transformers sharing the same utility-grid interface.

It should be appreciated that in some embodiments a control conflict may not exist between the active power factor correction and any other mode of the system control operation, which can be MPT mode or a non-MPT mode.

In some embodiments, regardless of the status of the input power source, e.g., power provider during the day or zero power provider during the night, the inverter may provide active power factor correction at all times when a set of inverter loads are included as part of the inverter system sharing the same utility-grid transmission cable. Furthermore, regardless of the type of the input power source, e.g., a solar array, battery, wind-power generation, the inverter may manage the power transfer from the source to the utility grid. The inverter in some embodiments may charge the input power source from the utility grid due to the bi-directional power processing capability.

A harmonic cancellation method may remove the harmonic content from being present to the inverter output voltage in some embodiments. This may leave the inverter voltage with the anticipated sinusoidal waveform at the utility grid frequency.

In further embodiments, a 0-ADC regulation control may ensure that the inverter output current may include a zero DC component during the transient and steady state. This may prevent magnetic saturation from occurring to isolation transformers sharing the same utility grid interface.

In yet another embodiment, active power factor correction may be accomplished using a maximum power tracking mode or a non-maximum power tracking mode.

In some embodiments, an apparatus for maximum power tracking control may include a selectable switch configured to select a set point reference voltage or a reference voltage as a peak power voltage. The apparatus may also include an input voltage regulation controller configured to process the peak power voltage and deliver an error voltage control signal to command a sine-wave regulation controller to deliver a pulse width modulation switching signal to a pulse width modulation switching driver.

In a further embodiment, the apparatus may include a maximum power tracking controller configured to update the set-point reference voltage when feedback signals are received. The feedback signals may include a direct current source voltage and a direct current source current.

In yet a further embodiment, the set-point reference voltage may command the input voltage regulation controller to produce the error voltage control signal to regulate the direct current source voltage at a level corresponding to the set point reference voltage or the peak power voltage.

Also in a further embodiment, the reference voltage may command the input voltage regulation controller to produce the error voltage control signal to regulate the direct current source voltage at a level corresponding to the reference voltage or the peak power voltage. The error voltage control signal may be band-limited and include a negligible AC ripple voltage.

In certain embodiments, an apparatus may include a switching network. The switching network may include a first output terminal and a second output terminal, and may provide a differential mode switching alternative current voltage. The apparatus may also include an output electromagnetic interference filter that may deliver excess power from a solar array source to utility grid via a grid interface inductor.

In a further embodiment, the differential mode switching alternative current voltage may include a repetitive pulsating train of a switched input voltage having a pulse width varied in time as a sinusoidal function. The sinusoidal function may include a fundamental frequency that matches a utility grid frequency.

In yet a further embodiment, the differential mode switching alternative current voltage may include a switching voltage ripple that is low pass filtered through an inductor, an isolation transformer, and the output electromagnetic interference filter.

Also in a further embodiment, the excess power may include an in-phase alternating current. The in-phase alternative current may be achieved when a load consumes less power than available maximum power of the solar array source. In some embodiments, when the load consumes more power than the maximum power of the solar array source, the in-phase alternating current may be switched to be out-of-phase with respect to a utility grid voltage to provide the load with extra power delivered from the utility grid.

In an alternative embodiment, an apparatus for controlling a sinusoidal inverter output voltage may include a sine wave regulation controller. The sine wave regulation controller may receive a commanding reference voltage signal from a phase controlled reference sine-wave generator, and receive an error voltage control signal from an input voltage regulation controller. The sine wave regulation controller may also generate a pulse width modulation signal to drive a switching network.

In a further embodiment, the commanding reference signal may include an alternating current sinusoidal waveform of a fixed amplitude having a same frequency as a frequency of a utility power grid.

Also in a further embodiment, the phase controlled reference sine-wave generator may further produce a phase shift of the commanding reference voltage signal with respect to a utility grid voltage.

In yet a further embodiment, the phase controlled reference sine-wave generator may generate a harmonic cancellation voltage derived from an input voltage of the apparatus and to insert the harmonic cancellation voltage into the commanding reference voltage signal with respect to a utility grid voltage. The cancellation voltage may be a ratio of an AC voltage content within the input voltage to a total input voltage, delivering the commanding reference voltage signal.

Also in a further embodiment, the phase controlled reference sine-wave generator may further operate with phase-lock-loop control to provide a stable phase synchronization with a utility grid voltage without a phase oscillation in a phase content $\phi$ belonging to the commanding reference voltage signal. The error control voltage signal may slowly change in some embodiments with a negligible alternative current ripple voltage having a ripple frequency twice a utility grid frequency. Also in some embodiments, the error control voltage signal regulates an output voltage of an inverter such that an alternating current voltage has negligible harmonic content. In further embodiments, the error control voltage signal may include a direct current value controlled by an input voltage regulation controller, an inverter input power limit regulation controller, or an inverter output voltage regulation controller.

In some embodiments, when the DC input power source possesses an available maximum power of less than a power rating of the apparatus, the inverter input power limit regulation controller may be excluded. In other embodiments, when a utility power grid produces a stable AC voltage comprising a root-means-square value within an acceptable voltage range, the inverter output voltage regulation controller may be excluded. In alternative embodiment, when a set of parallel-connected stand-alone AC loads is terminated across an output of the apparatus without being connected a utility power grid, the inverter output voltage regulation controller may be utilized.

In some embodiments, the input voltage regulation controller may prevent an input voltage of the inverter from collapsing below a voltage corresponding to a reference voltage or a set-point reference voltage. In a further embodiment, the input voltage regulation controller may control the error voltage control signal when a root means square value of the output voltage of the inverter is below a root means square voltage threshold and a first diode is in a blocking state.

In certain embodiments, the inverter output voltage regulation controller may control error control voltage signal when a root means square value of the output voltage of the inverter is above a root means square voltage threshold and a first diode is forward-biased.

It will be readily understood that the components of various embodiments of the present invention, as generally described and illustrated in the figures herein, may be arranged and designed in a wide variety of different configurations. Thus, the detailed description of the embodiments, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. An apparatus, comprising:
a power converter configured to receive a direct current (DC) output voltage from a DC input power source, and generate an alternating current (AC) output voltage for transmission to a utility power grid, a grid-interface circuit, or a set of parallel-connected AC loads; and
a system controller configured to regulate the AC output voltage to efficiently transfer power to the utility power grid and to ensure a zero DC value of an AC output current of the power converter, wherein
the system controller is further configured to
control an AC current of the utility grid to be out-of-phase with respect to a voltage of the utility power grid when a load consumes power exceeding a maximum power of the DC input power source or a rated limiting power of the apparatus, and
control the AC current of the utility grid to be in-phase with respect to the voltage of the utility power grid when the load consumes less power than a delivered output power of the power converter.

2. The apparatus of claim 1, wherein the power converter comprises a cascaded connection of an input electromagnetic interference filter, an input bulk capacitor, a power switching network, a switching inductor, and an output line-filter.

3. The apparatus of claim 1, wherein the power converter further comprises an isolation transformer configured to provide a voltage conversion and electrical isolation between the DC input power source and the utility power grid.

4. The apparatus of claim 1, wherein the utility power grid comprises a series connection of an AC voltage source and a grid-interface inductor.

5. The apparatus of claim 1, wherein the grid-interface circuit comprises a set of parallel-connected AC loads connected in parallel with the utility grid.

6. The apparatus of claim 1, wherein the set of parallel-connected AC loads comprise a resistive load, an inductive load, a capacitive load, or any combination thereof.

7. The apparatus of claim 1, wherein the system controller is further configured to generate an error control voltage signal to regulate a received DC input voltage of the power converter at a level corresponding to a set point reference voltage or a maximum peak power voltage.

8. The apparatus of claim 1, wherein
the system controller is further configured to control a waveform of the AC output voltage of the power converter to be sinusoidal, and
the waveform comprises a same frequency as a frequency of the utility power grid.

9. The apparatus of claim 1, wherein the system controller is further configured to control an AC current of the utility power grid to be in-phase or out-of-phase with respect to an AC voltage of the utility power grid.

10. The apparatus of claim 1, wherein the system controller is further configured to prevent the AC output voltage from exceeding a predetermined threshold value.

11. The apparatus of claim 1, wherein the system controller is further configured to limit the AC output voltage without exceeding a rated power of the apparatus or a maximum rated output voltage.

12. The apparatus of claim 1, wherein
the system controller is further configured to control the AC output current of the power converter to have a zero DC content at all times by including a 0-ADC regulation control, and
the 0-ADC regulation control receives the AC output current of the power converter, and delivers an DC offset voltage to provide a counter balance voltage for production of a pulse width modulation duty-ratio,
the pulse width modulation defined as $$d_{PWM}(t) = 0.5 + k \cdot V_{CON} \cdot \sin(\omega t + \phi) \cdot \left(1 - \frac{V_{INAC}}{V_{IN}}\right) + f(V_{OFF})$$

where $f(V_{OFF})$ is a counter balance voltage that is a function of the DC offset voltage produced by the 0-ADC regulation control, $V_{CON}$ is an error voltage control signal delivered by an input voltage regulation controller, an inverter input power limit regulation controller, or an inverter output voltage regulation controller, $\phi$ is a phase shift delivered by a phase-controlled reference sine-wave generator, and k is a proper scaling constant such that $k \cdot V_{CON} \leq 0.5$.

13. An apparatus for active power correction, comprising:
a switching network configured to:
  produce a positive output voltage for a period that is longer than that of a negative output voltage to cause an inverter to deliver a positive voltage, or
  produce the positive output voltage for a period that is shorter than that of the negative output voltage to cause the inverter to deliver a negative voltage;
a steering logic pulse with modulation (PWM) switching driver configured to convert a PWM switching signal to be a set of switching signals that drive the switching network; and
a phase-controlled reference SINE-WAVE generator configured to process a phase control signal and a utility grid voltage and produce a commanding reference signal and a reference co-sinusoidal voltage, wherein
the reference co-sinusoidal voltage possesses a 90 degree phase lead with respect to the utility grid voltage.

14. The apparatus of claim 13, further comprising:
a SINE-WAVE regulation controller configured to process the commanding reference signal and an error voltage control signal and produce the PWM switching signal.

15. The apparatus of claim 13, further comprising:
a reactive component detector and integrator further configured to process a utility grid current signal and the reference co-sinusoidal voltage and produce the phase control signal.

16. The apparatus of claim 13, wherein the phase controlled reference SINE-WAVE generator is further configured to generate a harmonic cancellation voltage derived from an input voltage of the apparatus and to insert the harmonic cancellation voltage into the commanding reference voltage signal with respect to a utility grid voltage.

17. The apparatus of claim 13, wherein the phase controlled reference SINE-WAVE generator is further configured to operate with a phase-lock-loop control,
  the phase-lock-loop (PLL) control provides a stable phase synchronization with a utility grid voltage without a phase oscillation in a phase content ϕ belonging to the commanding reference voltage signal, and the commanding reference voltage signal is defined by $SINE_{AC} = \sin(\omega t + \varnothing)(1 - V_{INAC}/V_{INALL})$, and
  the stable phase synchronization is achieved by an active filtering circuit for the PLL compensation, ensuring an in-phase output voltage of a PLL oscillator with respect to the utility grid voltage.

18. The apparatus of claim 13, wherein the SINE-WAVE regulation controller is further configured to process a DC offset voltage and produce the PWM switching signal with a duty ratio defined by $$d_{PWM}(t) = 0.5 + k \cdot V_{CON} \cdot \sin(\omega t + \phi) \cdot \left(1 - \frac{V_{INAC}}{V_{IN}}\right) + f(V_{OFF})$$

where $f(V_{OFF})$ is a counter balance voltage, the counter balance voltage is a function of the DC offset voltage produced by a 0-ADC regulation control, $V_{CON}$ is an error voltage control signal delivered by an input voltage regulation controller, an inverter input power limit regulation controller, or an inverter output voltage regulation controller, ϕ is a phase shift delivered by a phase-controlled reference SINE-WAVE generator, and k is a proper scaling constant such that $k \cdot V_{CON} \leq 0.5$.

19. The apparatus of claim 13, wherein the positive output voltage is produced during each odd half of a utility frequency period.

20. The apparatus of claim 13, wherein the negative output voltage is produced during each even half of a utility frequency period.

21. The apparatus of claim 13, wherein the switching network comprises a plurality of switching devices, each of the plurality of switching devices comprises a gate and source terminal connected to a driving voltage signal through a diode and resistor network.

22. The apparatus of claim 15, wherein the error voltage control signal is produced by an input voltage regulation controller, an inverter input power limit regulation controller, or an inverter output voltage regulation controller.

23. The apparatus of claim 16, wherein the cancellation voltage is a ratio of an AC voltage content within the input voltage to a total input voltage, delivering the commanding reference voltage signal, and
  the commanding reference voltage signal is defined by $SINE_{AC} = \sin(\omega t + \varnothing)(1 - V_{INAC}/V_{INALL})$.

24. The apparatus of claim 19, wherein, during each odd half of the utility frequency period, the commanding reference voltage signal is positive.

25. The apparatus of claim 20, wherein during each even half of the utility frequency period, the commanding reference voltage signal is negative.

* * * * *